US012234106B1

United States Patent
Lee et al.

(10) Patent No.: US 12,234,106 B1
(45) Date of Patent: Feb. 25, 2025

(54) APPARATUS FOR TRANSFERRING SUBSTRATE IN VACCUM CHAMBER

(71) Applicant: T-Robotics Co., Ltd., Osan-si (KR)

(72) Inventors: Soo Jong Lee, Suwon-si (KR); Chang Seong Lee, Hwaseong-si (KR); Chang Hyun Jee, Anyang-si (KR); Sang Hwi Ham, Seoul (KR)

(73) Assignee: T-ROBOTICS CO., LTD. (KR)

( * ) Notice: Subject to any disclaimer, the term of this patent is extended or adjusted under 35 U.S.C. 154(b) by 0 days.

(21) Appl. No.: 18/798,435

(22) Filed: Aug. 8, 2024

(30) Foreign Application Priority Data

Jun. 10, 2024 (KR) .................. 10-2024-0075304

(51) Int. Cl.
   *H01L 21/687* (2006.01)
   *B65G 47/90* (2006.01)
   *H01L 21/677* (2006.01)

(52) U.S. Cl.
   CPC ........ *B65G 47/90* (2013.01); *H01L 21/68707* (2013.01)

(58) Field of Classification Search
   CPC ......... H01L 21/68707; H01L 21/67742; H01L 21/67766; B25J 9/043
   See application file for complete search history.

(56) References Cited

U.S. PATENT DOCUMENTS

| | | | | |
|---|---|---|---|---|
| 5,605,487 A | * | 2/1997 | Hileman | H01L 21/68707 451/41 |
| 6,085,670 A | * | 7/2000 | Genov | B23Q 1/48 248/188.4 |
| 9,159,601 B2 | * | 10/2015 | Matsuzaki | B25J 9/126 |
| 12,080,586 B2 | * | 9/2024 | Lee | H01L 21/68707 |
| 2010/0209220 A1 | * | 8/2010 | Wagner | H01L 21/67766 901/46 |
| 2012/0201641 A1 | * | 8/2012 | Matsuzaki | H01L 21/67766 414/744.3 |
| 2013/0147437 A1 | * | 6/2013 | Yamada | H01L 21/67259 320/128 |

FOREIGN PATENT DOCUMENTS

| | | | | |
|---|---|---|---|---|
| JP | 2000150614 A | * | 5/2000 | |
| JP | 2014111310 A | * | 6/2014 | ....... H01L 21/67766 |
| JP | 2020016255 A | * | 1/2020 | ............... B25J 9/02 |

* cited by examiner

*Primary Examiner* — Gerald McClain
(74) *Attorney, Agent, or Firm* — Thompson Patent Law Offices PC

(57) ABSTRACT

A substrate transfer apparatus transfers a substrate in a vacuum chamber. The substrate transfer apparatus includes an elevating robot, a travel robot and a transfer robot. The elevating robot includes an elevating plate through which through-holes are formed, and hollow elevating shafts, wherein each central axis of the hollow elevating shafts corresponds to each center of the through-holes, wherein the elevating robot is sealably coupled with a vacuum chamber through-hole. The travel robot includes a travel arm platform through which coupling holes are formed, wherein each of the hollow elevating shafts is inserted into each lower space of each of the coupling holes, a first travel arm part including a (1_1)-st and a (1_2)-nd travel link arms, second travel arm parts including a (2_1)-st and a (2_2)-nd travel link arms, and a transfer robot coupling part coupled with the (1_2)-nd and the (2_2)-nd travel link arms.

15 Claims, 18 Drawing Sheets

APPARATUS FOR TRANSFERRING SUBSTRATE IN VACCUM CHAMBER

CROSS REFERENCE TO RELATED APPLICATION

This application claims the benefit of priority to Korean Patent Application No. 10-2024-0075304, filed on Jun. 10, 2024, the entire contents of which being incorporated herein by reference.

FIELD OF THE DISCLOSURE

The present disclosure relates to a substrate transfer apparatus; and more particularly, to the substrate transfer apparatus that allows long-distance transfer of high-load substrates within a vacuum chamber.

BACKGROUND OF THE DISCLOSURE

In general, a substrate such as a wafer for a semiconductor device, a glass substrate for a display device, or a glass substrate for a thin film solar cell is manufactured by performing various processes on the substrate. During these processes, the substrate is loaded and processed in a substrate processing apparatus that provides optimal conditions required for each of the processes. Additionally, masks are used as substrates to form various patterns.

Nowadays, in order to improve productivity for the substrate, a cluster-type substrate processing apparatus capable of collectively processing the substrate is being developed and used.

The cluster-type substrate processing apparatus includes a load lock chamber for loading or unloading the substrate, a transfer chamber for transferring the substrate, and a plurality of process chambers for performing each manufacturing process.

Additionally, a substrate transfer robot, installed in the transfer chamber that is in a vacuum state, may transfer the substrate back and forth between the transfer chamber and the load lock chamber, among multiple transfer chambers, or in and out of the process chambers.

Recently, in order to cope with a large size of the substrate and to improve a substrate processing capability, various researches are in progress to establish a structure capable of processing two substrates in one process chamber or to change an octagonal structure in which four process chambers are installed at equal distances around the transfer chamber to a tetragonal structure having the processing chambers installed on both sides of a transfer path of the transfer chamber.

Especially, in order to deal with an offset distance between respective locations of the two substrates in a structure where they are positioned within one process chamber or in order to account for install locations of each of the process chambers in the tetragonal structure, moving a position of the substrate transfer robot is inevitably required.

To this end, recently, after a travel robot is installed inside a vacuum chamber and then a transfer robot is installed on the travel robot, the travel robot is driven to move the transfer robot to a set position inside the vacuum chamber, and the transfer robot is then driven to transfer the substrate.

However, in a conventional substrate transfer apparatus like above, when a high-load substrate is transferred over a long distance, the robots transferring the substrate may droop due to the high load.

Therefore, when a tilted substrate due to the drooping of the robots is placed on the process station of the process chamber, a front end of the substrate may touch the process station first, thereby causing the slip.

In case the slip of the substrate is out of a preset error range, the substrate will deviate from a preset normal position, so the substrate must be realigned to the normal position.

Therefore, it may take a long time to realign the substrate.

SUMMARY OF THE DISCLOSURE

It is an object of the present disclosure to solve all the aforementioned problems.

It is another object of the present disclosure to provide a substrate transfer apparatus capable of accurately transferring a high-load substrate over a long distance.

It is still another object of the present disclosure to provide the substrate transfer apparatus capable of reducing drooping of robots when transferring the high-load substrate over the long distance.

It is still yet another object of the present disclosure to provide the substrate transfer apparatus capable of reducing substrate slip at a process station when transferring the high-load substrate over the long distance.

It is still yet another object of the present disclosure to provide the substrate transfer apparatus capable of accurately positioning the substrate at the process station when transferring the high-load substrate over the long distance.

The characteristic configurations of the present disclosure for achieving the object of the present disclosure as described above and realizing the characteristic effects of the present disclosure which will be described below are as follows.

In accordance with one aspect of the present disclosure, there is provided the substrate transfer apparatus that transfers the substrate in a vacuum chamber, comprising: an elevating robot including: (i) an elevating plate through which an $(a1\_1)$-st through-hole to an $(a1\_n)$-th through-hole are formed along to a first straight direction on a plane, wherein n is an integer greater than or equal to 2, wherein the elevating plate is formed in a lower part of the vacuum chamber to move up and down by an elevation driving unit, and (ii) a first hollow elevating shaft to an n-th hollow elevating shaft, wherein each of the first hollow elevating shaft to the n-th hollow elevating shaft has each one-end connected to an upper surface of the elevating plate and each opposite-end located in an inner space of the vacuum chamber such that each central axis of each of the first hollow elevating shaft to the n-th hollow elevating shaft corresponds to each center of each of the $(a1\_1)$-st through-hole to the $(a1\_n)$-th through-hole, wherein the elevating robot is sealably coupled with a vacuum chamber through-hole formed in a lower region of the vacuum chamber; a travel robot including: (i) a travel arm platform through which a $(b1\_1)$-st coupling hole to a $(b1\_n)$-th coupling hole, a b2-nd coupling hole and a b3-rd coupling hole are formed respectively in the first straight direction, a first one-end area in a second straight direction orthogonal to the first straight direction and a first opposite-end area in the second straight direction thereof, wherein each of a $(b1\_1)$-st stopping member to a $(b1\_n)$-th stopping member, through which each of a $(b1\_1)$-st through-hole to a $(b1\_n)$-th through-hole corresponding to each of hollow holes of the first hollow elevating shaft to the n-th hollow elevating shaft is formed, compartmentalizes each of the $(b1\_1)$-st coupling hole to the $(b1\_n)$-th coupling hole into each of a $(b1\_1)$-st upper space to a (b1_n)-th upper space sealed by each of a (b1_1)-st cover to a (b1_n)-th cover and each of a (b1_1)-st lower space to a (b1 n)-th lower space, wherein a b2-nd stopping member, through which a b2-nd through-hole is formed, compartmentalizes the b2-nd coupling hole into a b2-nd upper space and a b2-nd lower space which is sealed by a b2-nd cover, wherein a b3-rd stopping member, through which a b3-rd through-hole is formed, compartmentalizes the b3-rd coupling hole into a b3-rd upper space and a b3-rd lower space which is sealed by a b3-rd cover, and wherein each of the opposite ends of the first hollow elevating shaft to n-th hollow elevating shaft inserted into each of the (b1_1)-st lower space to the (b1_n)-th lower space is fixedly coupled with each of the (b1_1)-st stopping member to the (b1 n)-th stopping member, (ii) a first travel arm part including a (1_1)-st travel link arm and a (1_2)-nd travel link arm, wherein a first travel driving motor and a first speed reducer, interlocked with the first travel driving motor to reduce a rotational speed of the first travel driving motor by half, are installed in a sealed inner space of the (1_1)-st travel link arm, wherein a (1_1)-st hollow driving shaft interlocked with the first speed reducer and a (1_1)-st output shaft interlocked with the (1_1)-st hollow driving shaft are sealingly installed on a (1_1)-st one-end area of the (1_1)-st travel link arm, wherein a (1_2)-nd hollow driving shaft interlocked with the first travel driving motor and a (1_2)-nd output shaft interlocked with the (1_2)-nd hollow driving shaft are sealingly installed on a (1_1)-st opposite-end area of the (1_1)-st travel link arm, wherein the (1_1)-st output shaft of the (1_1)-st travel link arm is fixedly coupled with a (1_1)-st linking member that is inserted into the b2-nd upper space of the travel arm platform to be fixedly coupled with the b2-nd stopping member, and wherein a (1_2)-nd one-end area of the (1_2)-nd travel link arm is fixedly coupled with the (1_2)-nd output shaft of the (1_1)-st travel link arm, (iii) a second travel arm part including a (2_1)-st travel link arm and a (2_2)-nd travel link arm, wherein a second travel driving motor and a second speed reducer, interlocked with the second travel driving motor to reduce a rotational speed of the second travel driving motor by half, are installed in a sealed inner space of the (2_1)-st travel link arm, wherein a (2_1)-st hollow driving shaft interlocked with the second speed reducer and a (2_1)-st output shaft interlocked with the (2_1)-st hollow driving shaft are sealingly installed on a (2_1)-st one-end area of the (2_1)-st travel link arm, wherein a (2_2)-nd hollow driving shaft interlocked with the second travel driving motor and a (2_2)-nd output shaft interlocked with the (2_2)-nd hollow driving shaft are sealingly installed on a (2_1)-st opposite-end area of the (2_1)-st travel link arm, wherein the (2_1)-st output shaft of the (2_1)-st travel link arm is fixedly coupled with a (1_2)-nd linking member that is inserted into the b3-rd upper space of the travel arm platform to be fixedly coupled with the b3-rd stopping member, and wherein a (2_2)-nd one-end area of the (2_2)-nd travel link arm is fixedly coupled with the (2_2)-nd output shaft of the (2_1)-st travel link arm, and (iv) a transfer robot coupling part whose second one-end area is rotatably coupled with a (1_2)-nd opposite-end area of the (1_2)-nd travel link arm, whose second opposite-end area is rotatably coupled with a (2_2)-nd opposite-end area of the (2_2)-nd travel link arm, and whose first center area has a rotation driving motor built thereon; and wherein the travel robot reciprocates the transfer robot coupling part in the first straight direction by an operation of the first travel motor and the second travel motor; and a transfer robot, coupled with the transfer robot coupling part, configured to transfer the substrate.

As one example, the elevation driving unit of the elevating robot includes: a first screw nut to be fixedly coupled with a one-side of the elevating plate; a second screw nut to be fixedly coupled with an opposite-side symmetrical to the one-side of the elevating plate; a first screw shaft formed in a vertical direction perpendicular to the first straight direction and perpendicular to the ground, and coupled with the first screw nut to rotate; a second screw shaft formed in the vertical direction, and coupled with the second screw nut to rotate; an elevation driving motor configured to provide a driving force for rotating the first screw shaft and the second screw shaft; and a first belt and a second belt configured to transmit the driving force of the elevation driving motor to the first screw shaft and the second screw shaft, respectively.

As one example, the elevation driving unit of the elevating robot further includes: at least one first sliding guide formed on the one-side of the elevating plate and supporting a direction of up and down movement of the elevating plate; and at least one second sliding guide formed on the opposite-side of the elevating plate and supporting the direction of up and down movement of the elevating plate.

As one example, the elevating robot further includes: an a-th cover through which an (a2_1)-st through-hole to an (a2_n)-th through-hole are formed along the first straight direction, wherein each of the first hollow elevating shaft to the n-th hollow elevating shaft is inserted into the (a2_1)-st through-hole to the (a2_n)-th through-hole, and wherein the a-th cover is sealingly coupled with the vacuum chamber through-hole of the vacuum chamber, a first bellows to an n-th bellows through which each of the first hollow elevating shaft to the n-th hollow elevating shaft is inserted, and wherein a one end thereof is coupled with the upper surface of the elevating plate and an opposite end thereof is coupled with the a-th cover.

As one example, the transfer robot coupling part of the transfer robot further includes: a compliance configured to change, within the transfer robot coupling part, any one of a position where the (1_2)-nd opposite-end area of the (1_2)-nd travel link arm is rotatably coupled and a position where the (2_2)-nd opposite-end area of the (2_2)-nd travel link arm is rotatably coupled, in response to an external force, wherein the compliance is installed at any one end area of the second one-end area and the second opposite-end area.

As one example, the compliance includes: (i) a compliance body, which is movable in a longitudinal direction of the transfer robot coupling part within any one end area of the second one-end area and the second opposite-end area, and which is rotatably coupled with any one of the (1_2)-nd opposite-end area of the (1_2)-nd travel link arm and the (2_2)-nd opposite-end area of the (2_2)-nd travel link arm, (ii) at least one first sliding member formed in an upper surface of the compliance body, (iii) at least one second sliding member whose one-side surface is coupled with the first sliding member to be slid in the longitudinal direction of the transfer robot coupling part and whose opposite-side surface is fixedly coupled with the transfer robot coupling part, (iv) elastic members respectively formed in both sides of a moving path of the compliance body.

As one example, the travel arm platform of the travel robot includes: a first wiring hole configured to connect a (b1_k)-th upper space, which is any one of the (b1_1)-st upper space to the (b1_n)-th upper space, with the b2-nd lower space; and a second wiring hole configured to connect the (b1_k)-th upper space with the b3-rd lower space.

As one example, the travel arm platform of the travel robot includes: a (1_1)-st wiring hole configured to connect from a one-side surface of a body of the travel arm platform to a (b1_k)-th upper space, which is any one of the (b1_1)-st upper space to the (b1_n)-th upper space; a (2_1)-st wiring hole configured to connect from the one-side surface of the body of the travel arm platform to the b2-nd lower space; a (1_2)-nd wiring hole configured to connect from an opposite-side surface of the body of the travel arm platform, which is symmetrical to the one-side of the body of the travel arm platform based on the first straight direction, to the (b1_k)-th upper space; a (2_2)-nd wiring hole configured to connect from the opposite-side surface of the body of the travel arm platform to the b3-rd lower space; a first sealing cover configured to seal the (1_1)-st wiring hole and the (2_1)-st wiring hole on the one-side surface of the body of the travel arm platform; and a second sealing cover configured to seal the (1_2)-nd wiring hole and the (2_2)-nd wiring hole on the opposite-side surface of the body of the travel arm platform.

As one example, the travel robot is provided with a (1_1)-st intersection point, a (1_2)-nd intersection point, a (2_1)-st intersection point, a (2_2)-nd intersection point, a (3_1)-st intersection point and a (3_2)-nd intersection point, wherein the (1_1)-st intersection point is a point at which a second straight direction line, connecting a center point of the b2-nd coupling hole and a center point of the b3-rd coupling hole of the travel arm platform, and a longitudinal center line of the (1_1)-st travel link arm intersect, wherein the (1_2)-nd intersection point is a point at which the second straight direction line and a longitudinal center line of the (2_1)-st travel link arm intersect, wherein the (2_1)-st intersection point is a point at which the longitudinal center line of the (1_1)-st travel link arm and a longitudinal center line of the (1_2)-nd travel link arm intersect, wherein the (2_2)-nd intersection point is a point at which the longitudinal center line of the (2_1)-st travel link arm and a longitudinal center line of the (2_2)-nd travel link arm intersect, wherein the (3_1)-st intersection point is a point at which the longitudinal center line of the (1_2)-nd travel link arm and a longitudinal center line of the transfer robot coupling part intersect, and wherein the (3_2)-nd intersection point is a point at which the longitudinal center line of the (2_2)-nd travel link arm and the longitudinal center line of the transfer robot coupling part intersect, wherein a distance between the (1_1)-st intersection point and the (1_2)-nd intersection point and a distance between the (3_1)-st intersection point and the (3_2)-nd intersection point are determined as same with each other, and a distance between the (1_1)-st intersection point and the (2_1)-st intersection point, a distance between the (2_1)-st intersection point and the (3_1)-st intersection point, a distance between the (1_2)-nd intersection point and the (2_2)-nd intersection point and a distance between the (2_2)-nd intersection point and the (3_2)-nd intersection point are determined as same with each other, and wherein an absolute value of an angle formed between the travel arm platform and the (1_1)-st travel link arm at the (1_1)-st intersection point is determined as same with an absolute value of an angle formed between the travel arm platform and the (2_1)-st travel link arm at the (1_2)-nd intersection point, an absolute value of an angle formed between the (1_1)-st travel link arm and the (1_2)-nd travel link arm at the (2_1)-st intersection point is determined as same with an absolute value of an angle formed between the (2_1)-st travel link arm and the (2_2)-nd travel link arm at the (2_2)-nd intersection point, an absolute value of an angle formed between the (1_2)-nd travel link arm and the transfer robot coupling part at the (3_1)-st intersection point is determined as same with an absolute value of an angle formed between the (2_2)-nd travel link arm and the transfer robot coupling part at the (3_2)-nd intersection point.

As one example, the first travel driving motor and the second travel driving motor of the travel robot operate in the same manner but with an opposite rotation direction.

As one example, the transfer robot includes: a transfer arm platform including (i) a c1-st coupling hole, formed at a second center area which is a specific area on the center line corresponding to the linear movement direction of the substrate moved by the transfer robot, wherein a c1-st stopping member, through which a c1-st through-hole corresponding to a hollow hole of a rotation driving shaft of the rotation driving motor of the transfer robot coupling part is formed, compartmentalizes the c1-st coupling hole into a c1-st upper space sealed by a c1-st cover and a c1-st lower space, (ii) a c2-nd coupling hole, formed at a third one-side area which is a one-side area with the center line, wherein a c2-nd stopping member, through which a c2-nd through-hole is formed, compartmentalize the c2-nd coupling hole into a c2-nd upper space and a c2-nd lower space which is sealed by a c2-nd cover, (iii) a c3-rd coupling hole, formed at a third opposite-side area which is an opposite-side area with the center line corresponding to the third one-side area, wherein a c3-rd stopping member, through which a c3-rd through-hole is formed, compartmentalizes the c3-rd coupling hole into a c3-rd upper space and a c3-rd lower space which is sealed by a c3-rd cover, (iv) a (1_1)-st blade and a (1_2)-nd blade formed respectively at a forward part and a backward part of the c2-nd coupling hole, wherein the forward part corresponds to a direction in which a processing chamber is positioned while the transfer robot is positioned to transfer a substrate to the processing chamber which is coupled with the vacuum chamber, and wherein the backward part corresponds to an opposite direction of the forward part, (v) a (2_1)-st blade and a (2_2)-nd blade formed respectively at the forward part and the backward part of the c3-rd coupling hole; and wherein the rotation driving shaft of the rotation driving motor inserted into the c1-st lower space is fixedly coupled with the c1-st stopping member, a first transfer arm part including a (1_1)-st transfer link arm, a (1_2)-nd transfer link arm, a first common link arm, a (1_1)-st subordinate link arm which is parallel to the (1_1)-st transfer link arm, a (1_2)-nd subordinate link arm which is parallel to the (1_1)-st transfer link arm, a (1_3)-rd subordinate link arm which is parallel to the (1_2)-nd transfer link arm, a (1_4)-th subordinate link arm which is parallel to the first common link arm and a first end-effector, wherein a first transfer driving motor and a third speed reducer, interlocked with the first transfer driving motor to reduce a rotational speed of the first transfer driving motor by half, are installed in a sealed inner space of the (1_1)-st transfer link arm, wherein a (3_1)-st hollow driving shaft interlocked with the third speed reducer and a (3_1)-st output shaft interlocked with the (3_1)-st hollow driving shaft are sealingly installed on a (3_1)-st one-end area of the (1_1)-st transfer link arm, wherein a (3_2)-nd hollow driving shaft interlocked with the first transfer driving motor and a (3_2)-nd output shaft interlocked with the (3_2)-nd hollow driving shaft are sealingly installed on a (3_1)-st opposite-end area of the (1_1)-st transfer link arm, wherein the (3_1)-st output shaft of the (1_1)-st transfer link arm is fixedly coupled with a (2_1)-st linking member that is inserted into the c2-nd upper space of the transfer arm platform to be fixedly coupled with the c2-nd stopping member, wherein a (3_2)-nd one-end area of the (1_2)-nd transfer link arm is fixedly coupled with the (3-2)-nd output shaft of the (1_1)-st transfer link arm through a first fixed coupling shaft, wherein a third center area of the first common link arm is rotatably coupled with the first fixed coupling shaft, wherein a (3_4)-th one-end area of the (1_1)-st subordinate link arm is rotatably coupled with the (1_1)-st blade of the transfer arm platform and a (3_4)-th opposite-end area of the (1_1)-st subordinate link arm is rotatably coupled with a (3_3)-rd one-end area of the first common link arm, wherein a (3_5)-th one-side area of the (1_2)-nd subordinate link arm is rotatably coupled with the (1_2)-nd blade of the transform arm platform and a (3_5)-th opposite-end area of the (1_2)-nd subordinate link arm is rotatably coupled with a (3_3)-rd one-end area of the first common link arm, wherein (3_6)-th one-end area of the (1_3)-rd subordinate link arm is rotatably coupled with a (3_3)-rd opposite-end area of the first common link arm, wherein a (3_7)-th one-end area of the (1_4)-th subordinate link arm is rotatably coupled with a (3_6)-th opposite-end area of the (1_3)-nd subordinate link arm and a (3_7)-th opposite-end area of the (1_4)-th subordinate link arm is rotatably coupled with a (3_2)-nd opposite-end area of the (1_2)-nd transfer link arm, and wherein the first end-effector is fixed to the (3_7)-th opposite-end area of the (1_4)-th subordinate link arm to thereby support the substrate; and a second transfer arm part including a (2_1)-st transfer link arm, a (2_2)-nd transfer link arm, a second common link arm, a (2_1)-st subordinate link arm parallel to the (2_1)-st transfer link arm, a (2_2)-nd subordinate link arm parallel to the (2_1)-st transfer link arm, a (2_3)-rd subordinate link arm parallel to the (2_2)-nd transfer link arm, a (2_4)-th subordinate link arm parallel to the second common link arm, and a second end-effector, wherein a second transfer driving motor and a fourth speed reducer, interlocked with the second transfer driving motor to reduce a rotational speed of the second transfer driving motor by half, are installed in a sealed inner space of the (2_1)-st transfer link arm, wherein a (4_1)-st hollow driving shaft interlocked with the fourth speed reducer and a (4_1)-st output shaft interlocked with the (4_1)-st hollow driving shaft are sealingly installed on a (4_1)-st one-end area of the (2_1)-st transfer link arm, wherein a (4_2)-nd hollow driving shaft interlocked with the second transfer driving motor and a (4_2)-nd output shaft interlocked with the (4_2)-nd hollow driving shaft are sealingly installed on a (4_1)-st opposite-end area of the (2_1)-st transfer link arm, wherein the (4_1)-st output shaft of the (2_1)-st transfer link arm is fixedly coupled with a (2_1)-st linking member that is inserted into the c3-rd upper space of the transfer arm platform to be fixedly coupled with the c3-rd stopping member, wherein a (4_2)-nd one-end area of the (2_2)-nd transfer link arm is fixedly coupled with the (4_2)-nd output shaft of the (2_1)-st transfer link arm through a second fixed coupling shaft, wherein a fourth center area of the second common link arm is rotatably coupled with the second fixed coupling shaft, wherein a (4_4)-th one-end area of the (2_1)-st subordinate link arm is rotatably coupled with the (2_1)-st blade of the transfer arm platform and a (4_4)-th opposite-end area of the (2_1)-st subordinate link arm is rotatably coupled with a (4_3)-rd one-end area of the second common link arm, wherein a (4_5)-th one-side area of the (2_2)-nd subordinate link arm is rotatably coupled with the (2_2)-nd blade of the transfer arm platform and a (4_5)-th opposite-end area of the (2_2)-nd subordinate link arm is rotatably coupled with a (4_3)-rd one-end area of the second common link arm, wherein the (4_6)-th one-end area of the (2_3)-rd subordinate link arm is rotatably coupled with the (4_3)-rd opposite-end area of the second common link arm, wherein the (4_7)-th one-end area of the (2_4)-th subordinate link arm is rotatably coupled with the (4_6)-th opposite-end area of the (2_3)-nd subordinate link arm and the (4_7)-th opposite-end area of the (2_4)-th subordinate link arm is rotatably coupled with a (4_2)-nd opposite-end area of the (2_2)-nd transfer link arm, and wherein the second end-effector is fixed to the (4_7)-th opposite-end area of the (2_4)-th subordinate link arm to thereby support the substrate.

As one example, a height of the second fixed coupling shaft is set as higher than a height of the first fixed coupling shaft such that the first end-effector and the second end-effector are positioned at different heights on a same route.

As one example, the transfer arm platform further includes a third wiring hole connecting the c1-st upper space and the c2-nd lower space; and a fourth wiring hole connecting the c1-st upper space and the c3-rd lower space.

As one example, the transfer arm platform includes an upper plate and a lower plate, wherein the upper plate includes the (1_1)-st blade, the (1_2)-nd blade, (2_1)-st blade and the (2_2)-nd blade, and wherein the lower plate is coupled with the upper plate, wherein a c1-st upper coupling hole, which is a part of the c1-st coupling hole, is formed at the second central area of the upper plate, wherein a c2-nd upper coupling hole, which is a part of the c2-nd coupling hole, is formed at the third one-side area of the upper plate, and a c2-nd stopping member, through which the c2-nd through-hole is formed inside the c2-nd upper coupling hole, compartmentalize the inner space of the c2-nd upper coupling hole, wherein a c3-rd upper coupling hole, which is a part of the c3-rd coupling hole, is formed at the third opposite-side area of the upper plate, and a c3-rd stopping member, through which the c3-rd through-hole is formed inside the c3-rd upper coupling hole, compartmentalize the inner space of the c3-rd upper coupling hole, wherein a c1-st lower coupling hole, which is a part of the c1 coupling hole, is formed at the second central area of the lower plate, and a c1-st stopping member, through which the c1-st through-hole is formed inside the c1-st lower coupling hole, compartmentalize the inner space of the c1-st lower coupling hole, wherein a c2-nd lower coupling hole, which is another part of the c2-nd coupling hole, is formed at the third one-side area of the lower plate, wherein a c3-rd lower coupling hole, which is another part of the c3 coupling hole, is formed at the third opposite-side area of the lower plate.

As one example, a third upper wiring slot and a fourth upper wiring slot are formed in a lower surface of the upper plate, wherein the third upper wiring slot connects an inner space of the c1-st upper coupling hole with a lower space of the c2-nd upper coupling hole, and the fourth upper wiring slot connects the inner space of the c1-st upper coupling hole with a lower space of the c3-rd upper coupling hole, and wherein a third lower wiring slot and a fourth lower wiring slot are formed in an upper surface of the lower plate, wherein the third lower wiring slot connects an upper space of the c1-st lower coupling hole with an inner space of the c2-nd lower coupling hole, and the fourth lower wiring slot connects the upper space of the c1-st lower coupling hole with an inner space of the c3-rd lower coupling hole.

BRIEF DESCRIPTION OF THE DRAWINGS

The accompanying drawings used to explain example embodiments of the present disclosure are only part of example embodiments of the present disclosure and other drawings may be obtained based on the drawings by those skilled in the art of the present disclosure without inventive work.

DETAILED DESCRIPTION OF THE PREFERRED EMBODIMENTS

Figure 1:
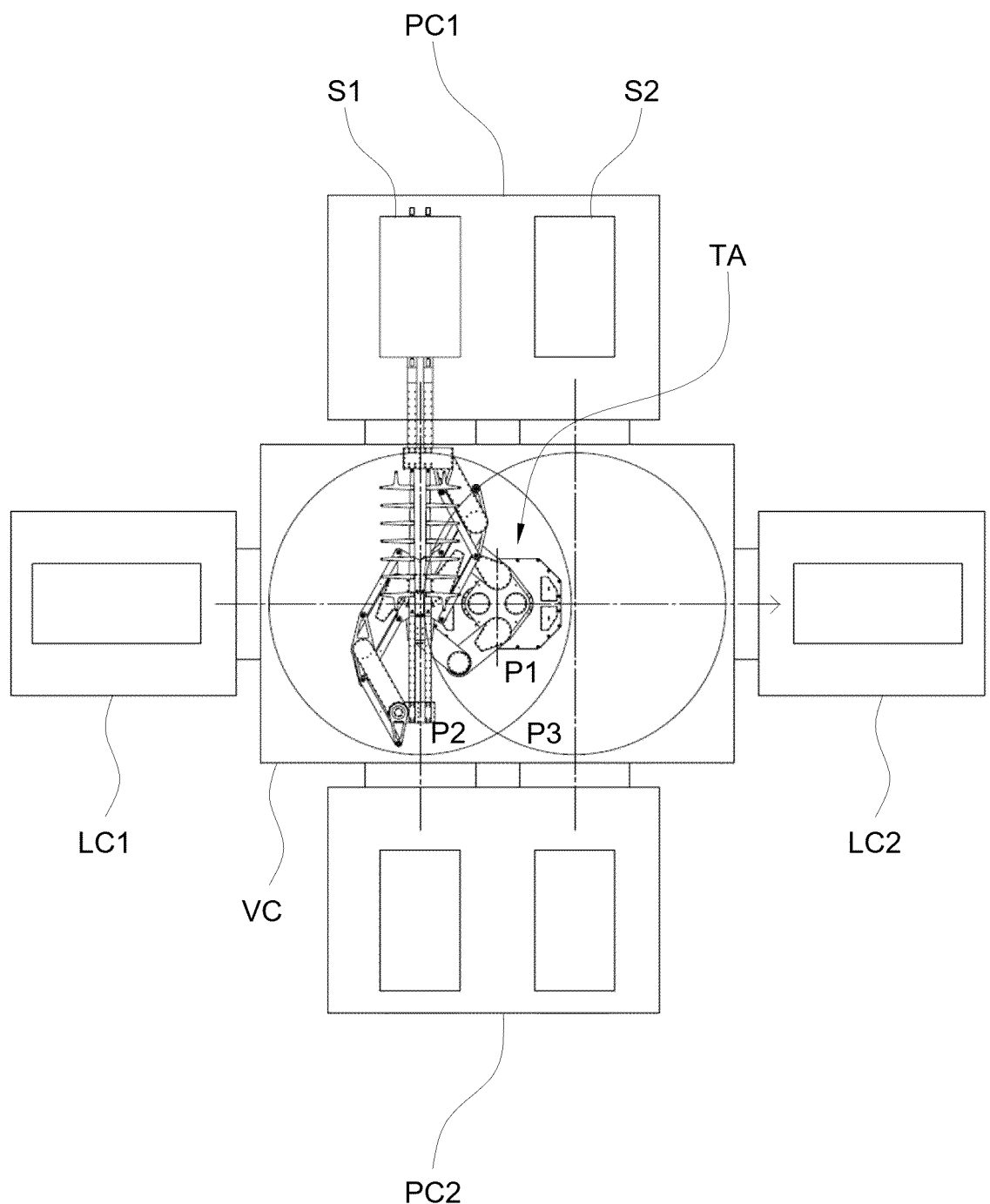
FIG. 1 is a drawing illustrating a cluster-type substrate processing apparatus in which a substrate transfer apparatus is installed in accordance with one example embodiment of the present disclosure.

The following detailed description of the present disclosure refers to the accompanying drawings, which show by way of illustration a specific embodiment in which the present disclosure may be practiced, in order to clarify the objects, technical solutions and advantages of the present disclosure. These embodiments are described in sufficient detail to enable those skilled in the art to practice the present disclosure.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the present disclosure, although different, are not necessarily mutually exclusive. For example, a particular feature, structure, or characteristic described herein in connection with one embodiment may be implemented within other embodiments without departing from the spirit and scope of the present disclosure. In addition, it is to be understood that the position or arrangement of individual elements within each disclosed embodiment may be modified without departing from the spirit and scope of the present disclosure. The following detailed description is, therefore, not to be taken in a limiting sense, and the scope of the present disclosure is defined only by the appended claims, appropriately interpreted, along with the full range of equivalents to which the claims are entitled. In the drawings, like numerals refer to the same or similar functionality throughout the several views.

To allow those skilled in the art to carry out the present disclosure easily, the example embodiments of the present disclosure will be explained by referring to attached diagrams in detail as shown below.

FIG. 1 is a drawing schematically illustrating a cluster-type substrate processing apparatus in which a substrate transfer apparatus is installed in accordance with one example embodiment of the present disclosure.

FIG. 1 is related to a substrate processing apparatus in which each one of process chamber PC1, PC2 is installed on each side of a vacuum chamber VC, which is a transfer chamber having a tetragonal structure, and each process chamber can accommodate two substrates. Herein, the substrate transfer apparatus TA is fixedly installed at a specific position P1 within the vacuum chamber VC. Further, a travel robot of the substrate transferring apparatus TA drives the transfer robot to transfer the substrate to positions of the two substrates in each process chamber.

As an example, on condition that the travel robot of the substrate transfer apparatus TA has moved the transfer robot to locate the transfer robot at a first position P2 which corresponds to a first substrate position S1 in a first process chamber PC1 and that the transfer robot of the substrate transfer apparatus TA has faced the first substrate position S1 of the first process chamber PC1 by a rotation thereof, the substrate is able to be loaded or unloaded onto or from the first substrate position S1 by activating an end-effector.

Also, on condition that the travel robot of the substrate transfer apparatus TA has moved the transfer robot to locate the transfer robot at a second position P3 which corresponds to a second substrate position S2 in the first process chamber PC1 and that the transfer robot of the substrate transfer apparatus TA has faced the second substrate position S2 of the first process chamber PC1 by a rotation thereof, the substrate is able to be loaded or unloaded onto or from the second substrate position S2 by activating the end-effector.

FIG. 1 exemplarily illustrates the substrate processing apparatus having the tetragonal structure, but the present disclosure is not limited thereto. In a state where the substrate transfer apparatus TA according to one example embodiment of the present disclosure is fixedly installed at a specific position in a vacuum chamber having one of various structures, the travel robot can drive the transfer robot along various set paths.

Figure 2A:
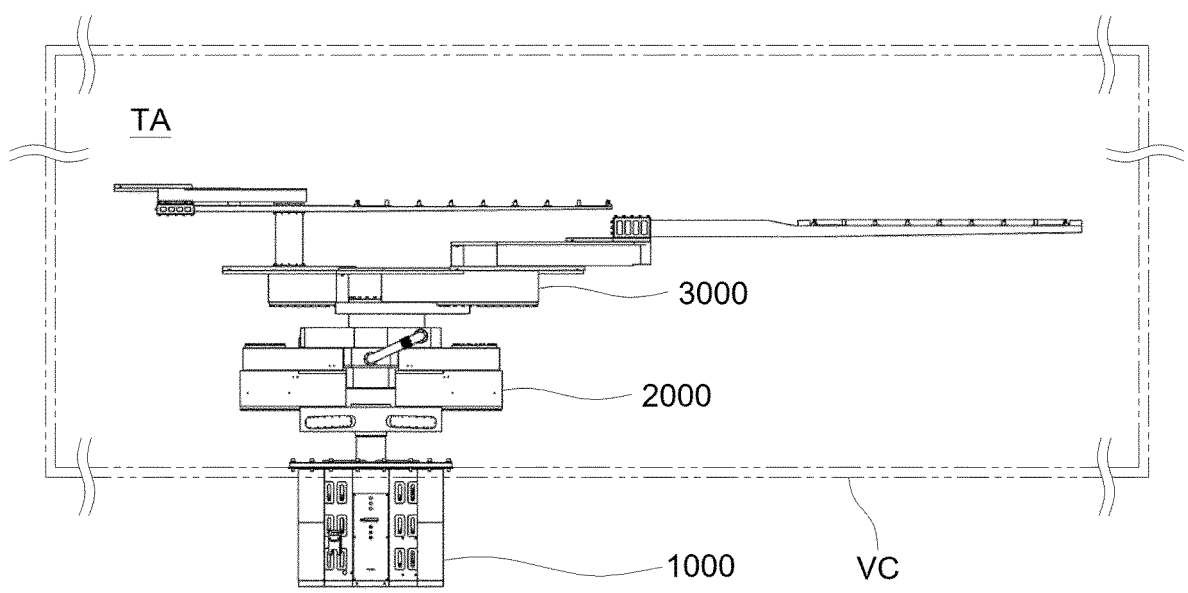
FIG. 2A and FIG. 2B are drawings schematically illustrating the substrate transfer apparatus in accordance with one example embodiment of the present disclosure.
Figure 2B:
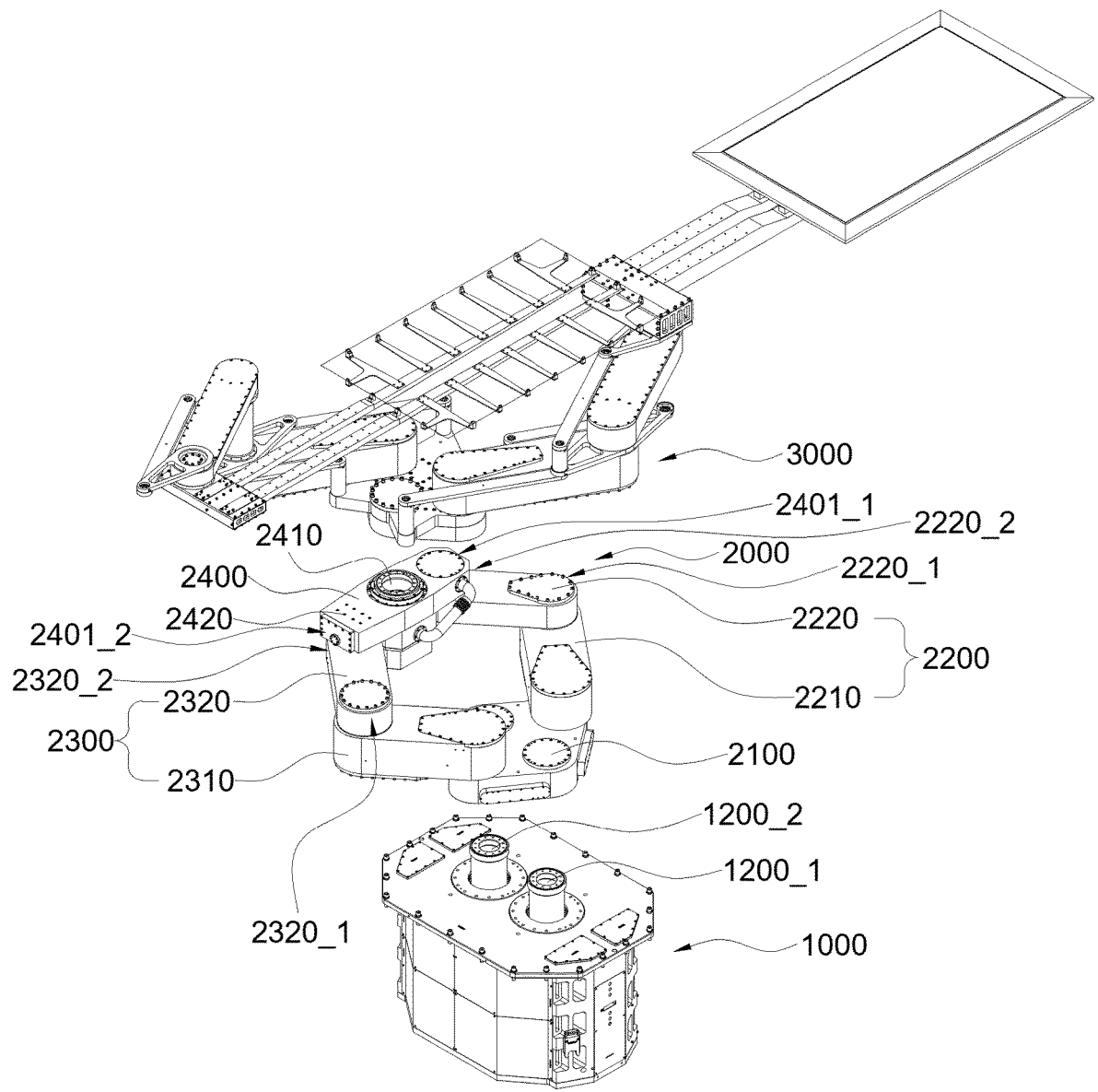

FIG. 2A and FIG. 2B are drawings schematically illustrating the substrate transfer apparatus TA in accordance with one example embodiment of the present disclosure.

By referring to FIG. 2A and FIG. 2B, the substrate transfer apparatus TA may include an elevating robot 1000, a travel robot 2000 that is coupled with the elevating robot 1000, and a transfer robot 3000 that is coupled with the travel robot 2000.

First, the elevating robot 1000 may be located in an outer lower region of a housing that seals an inner space of the vacuum chamber VC, and an upper region of the elevating robot 1000 may be sealingly coupled with a vacuum chamber through-hole (not shown) which is formed in a lower region of the housing of the vacuum chamber VC. Further, the elevating robot 1000 may move a first hollow elevating shaft to an n-th hollow elevating shaft up and down. Herein, n is an integer greater than or equal to 2, and although only two hollow elevating shafts are illustrated in the drawing, the present disclosure is not limited thereto. That is, the hollow elevating shafts may be formed in a number of two or more. Also, in the drawings below, although the components corresponding to the hollow elevating shafts are also illustrated to correspond to the two hollow elevating shafts, the components corresponding to the hollow elevating shafts can be formed as much as the number of the hollow elevating shafts.

Through this, by regulating a vertical position of the transfer robot 3000, the elevating robot 1000 can make the transfer robot 3000 be located at a height which is appropriate for loading or unloading the substrate into or from the process chamber, etc.

Figure 3A:
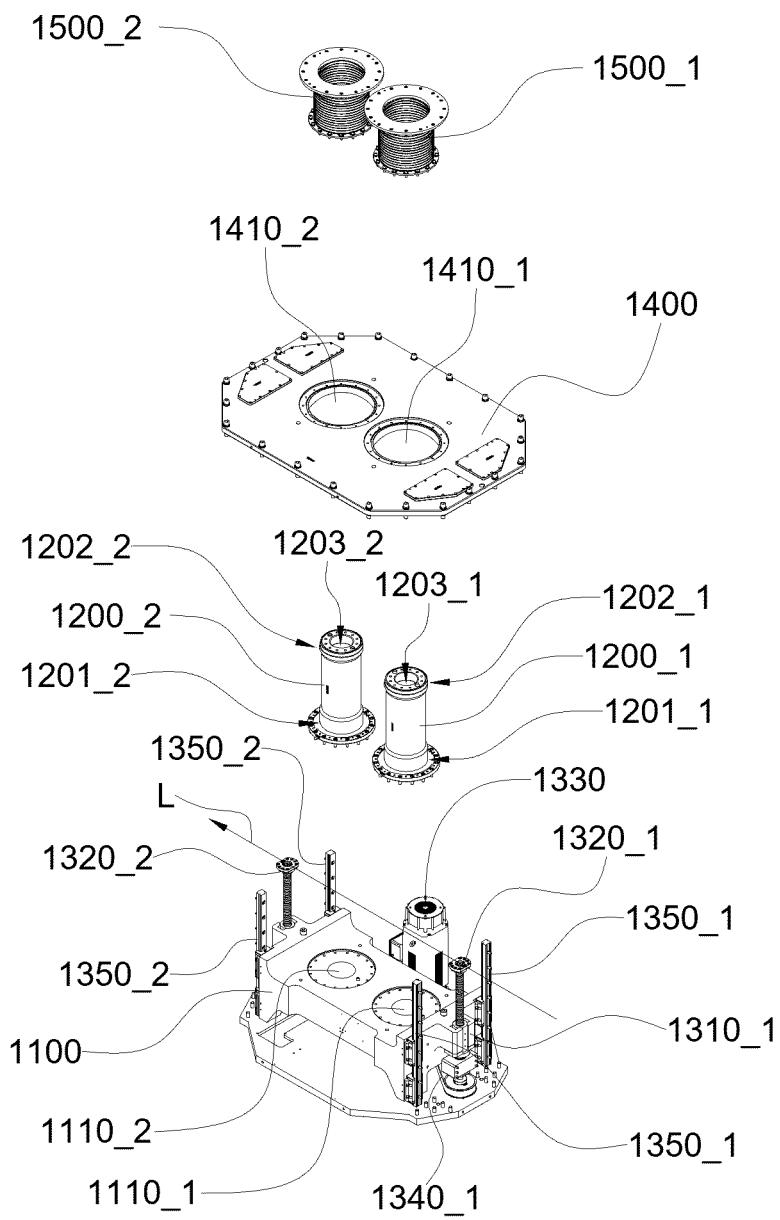
FIG. 3A and FIG. 3B are drawings schematically illustrating an elevating robot in the substrate transfer apparatus in accordance with one example embodiment of the present disclosure.
Figure 3B:
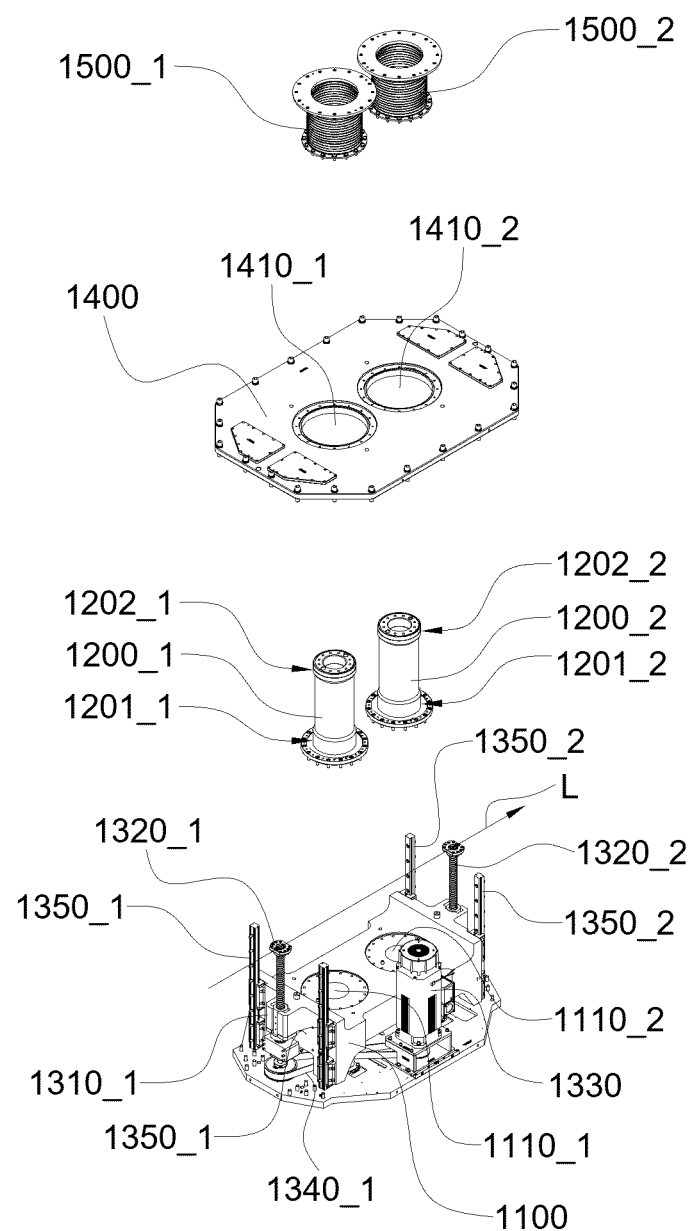

As an example, the elevating robot 1000 may be described in more detail by referring to FIG. 3A and FIG. 3B as follows.

The elevating robot 1000 may include an elevating plate 1100 formed in the lower part of the vacuum chamber and configured to move up and down by an elevation driving unit. An (a1_1)-st through-hole 1110_1 to an (a1_n)-th through-hole 1110_2 are formed through the elevating plate 1100 along a first straight direction L on a plane.

Also, the elevating robot 1000 may include a first hollow elevating shaft 1200_1 to an n-th hollow elevating shaft 1200_2 whose each one-end 1201_1 and 1201_2 is connected to an upper surface of the elevating plate 1100 and whose each opposite-end 1202_1 and 1202_2 is located in an inner space of the vacuum chamber. Further, each central axis of each of the first hollow elevating shaft 1200_1 to the n-th hollow elevating shaft 1200_2 corresponds to each center of each of the (a1_1)-st through-hole 1110_1 to the (a1_n)-th through-hole 1110_2 such that each one-end thereof is connected to the upper surface of the elevating plate 1100.

Meanwhile, the elevation driving unit of the elevating robot 1000 that moves the elevating plate 1100 up and down can include a first screw nut 1310_1 to be fixedly coupled with a one-side surface of the elevating plate 1100 and a second screw nut (not shown) to be fixedly coupled with an opposite-side surface of the elevating plate 1100. Herein, the one-side surface and the opposite-side surface of the elevating plate 1100 may be side surfaces which are symmetrical to each other with respect to the center of gravity of the elevating plate 1100, but they are not limited thereto.

Also, each of the first screw nut 1310_1 and the second screw nut can be rotatably coupled with each of a first screw shaft 1320_1 and a second screw shaft 1320_2 each of which is formed in a vertical direction perpendicular to the first straight direction L.

In addition, the elevation driving unit of the elevating robot 1000 can include an elevation driving motor 1330 capable of providing driving force for rotating the first screw shaft 1320_1 and the second screw shaft 1320_2. Further, a first belt 1340_1 and a second belt (not shown) may be installed in the elevation driving unit of the elevating robot 1000. In detail, the first belt 1340_1 for transmitting the driving force of the elevation driving motor 1330 to the first screw shaft 1320_1 and the second belt (not shown) for transmitting the driving force of the elevation driving motor 1330 to the second screw shaft 1320_2 are mounted onto the elevation driving unit of the elevating robot 1000.

Herein, the first belt and the second belt may be respectively configured as a timing belt. Further, the first belt may be coupled with timing pulleys which are respectively coupled with the driving shaft of the elevation driving motor 1330 and the first screw shaft 1320_1, and the second belt may be coupled with timing pulleys which are respectively coupled with the driving shaft of the elevation driving motor 1330 and the second screw shaft 1320_2. However, although it is described that transmission of the driving force between the elevation driving motor and the screw shafts is performed by the pulleys, the present disclosure is not limited thereto, and various methods for transmitting the driving force, such as a method using gears, may be adopted.

Accordingly, in the elevation driving unit of the elevating robot 1000, the first screw shaft and the second screw shaft rotate according to the operation of the elevation driving motor, and accordingly, the elevating plate 1100 combined with the first screw nut and the second screw nut moves up and down in response to a rotation direction of the elevation driving motor.

Also, the elevation driving unit of the elevating robot 1000 can include at least one first sliding guide 1350_1 formed on the one-side surface of the elevating plate 1100 supporting a direction of the vertical (i.e., up-and-down) movement of the elevating plate 1100; and at least one second sliding guide 1350_2 formed on the opposite-side surface of the elevating plate 1100 supporting the direction of the vertical movement of the elevating plate 1100. Herein, a plurality of the sliding guides which are formed at each side surface may have been formed in order to support the vertical movement of the elevating plate 1100.

And the elevating robot 1000 can be sealingly coupled with the vacuum chamber through-hole of the vacuum chamber using an a-th cover 1400. Herein, the a-th cover 1400 is configured to form an (a2_1)-st through-hole 1410_1 to an (a2_n)-th through-hole 1410_2 through which each of the first hollow elevating shaft 1200_1 to the n-th hollow elevating shaft 1200_2 is inserted in the first straight direction.

Also, the elevating robot 1000 can include a first bellows 1500_1 to an n-th bellows 1500_2 through which each of the first hollow elevating shaft 1200_1 to the n-th hollow elevating shaft 1200_2 is inserted. Herein, each one end of the first bellows 1500_1 to the n-th bellows 1500_2 is coupled with the upper surface of the elevating plate 1100 and each opposite end of the first bellows 1500_1 to the n-th bellows 1500_2 is coupled with the a-th cover 1400. As mentioned above, a plurality of bellows can be installed at each of the first hollow elevating shaft to the n-th hollow elevating shaft, but they are not limited thereto. Alternatively, a single bellows having a diameter that can accommodate all of the first hollow elevating shaft to the n-th hollow elevating shaft may be installed.

Next, by referring to FIG. 2B again, the travel robot 2000 may include a travel arm platform 2100 coupled with the first hollow elevating shaft 1200_1 to the n-th hollow elevating shaft 1200_2 of the elevating robot 1000, a first travel arm part 2200 and a second travel arm part 2300 that are symmetrically mounted onto the travel arm platform 2100, and a transfer robot coupling part 2400 that is coupled with the first travel arm part 2200 and the second travel arm part 2300. Herein, the transfer robot 3000 for transferring the substrate can be mounted onto the transfer robot coupling part 2400. Further, the transfer robot 3000 can travel within the vacuum chamber by moving the transfer robot coupling part 2400 forward and backward through the operation of the first travel arm part 2200 and the second travel arm part 2300.

Through this, on condition that the travel robot 2000 is fixed at a specific position within the vacuum chamber, the travel robot 2000 moves the transfer robot coupling part 2400 forward and backward through the operation of the first travel arm part 2200 and the second travel arm part 2300, thereby allowing the transfer robot 3000 coupled with the transfer robot coupling part 2400 to travel such that the transfer robot 3000 may locate at a set position, i.e., a position for loading or unloading the substrate into or from the process chamber. Further, the transfer robot 3000 can allow the substrate to be loaded or unloaded into or from the process chamber etc. by adjusting a vertical location of the transfer robot 3000 (that is, by moving the elevating robot 1000 up and down).

The more specific description on the travel robot 2000 of the substrate transfer apparatus according to one example embodiment of the present invention is as follows.

Figure 4A:
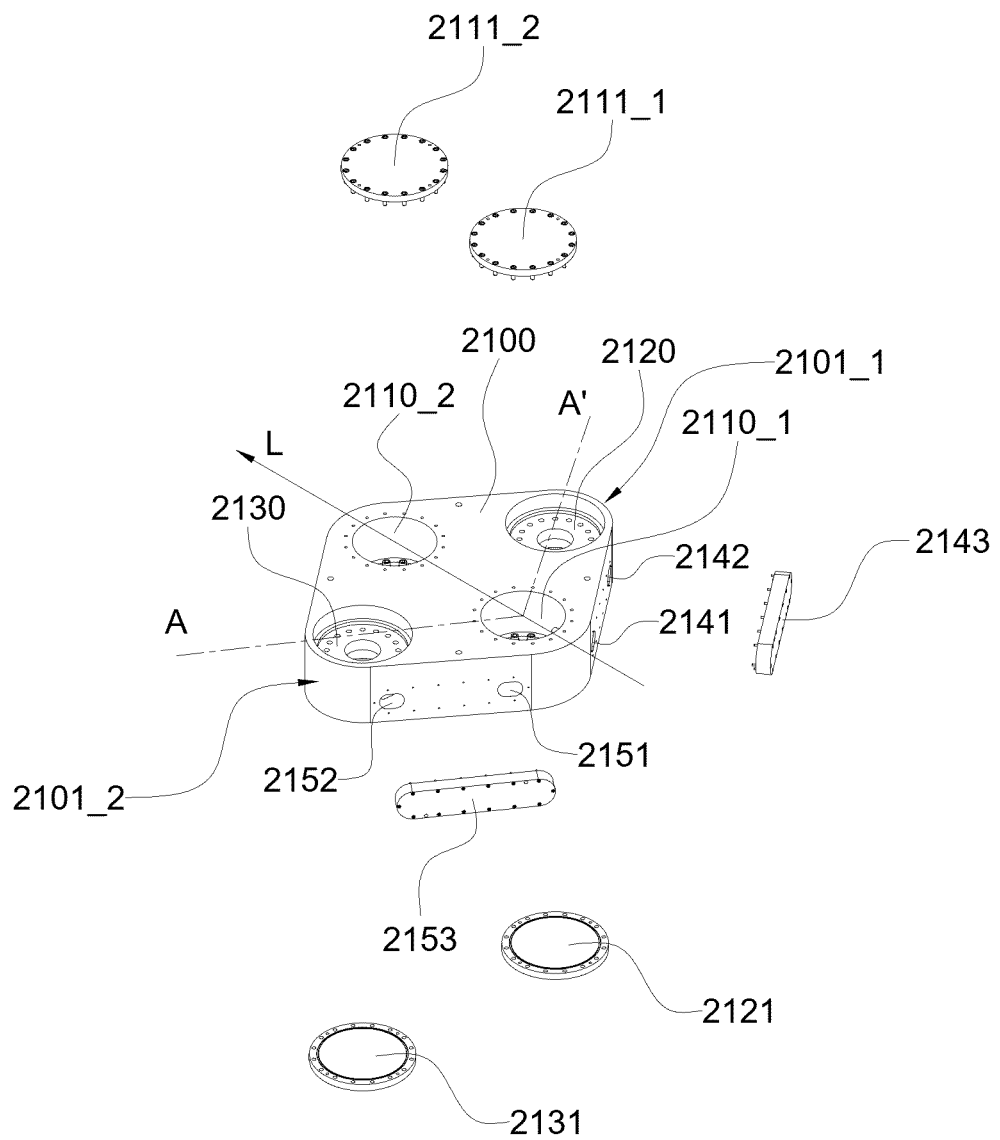
FIG. 4A, FIG. 4B, and FIG. 4C are drawings schematically illustrating a travel arm platform of a travel robot in the substrate transfer apparatus in accordance with one example embodiment of the present disclosure.
Figure 4B:
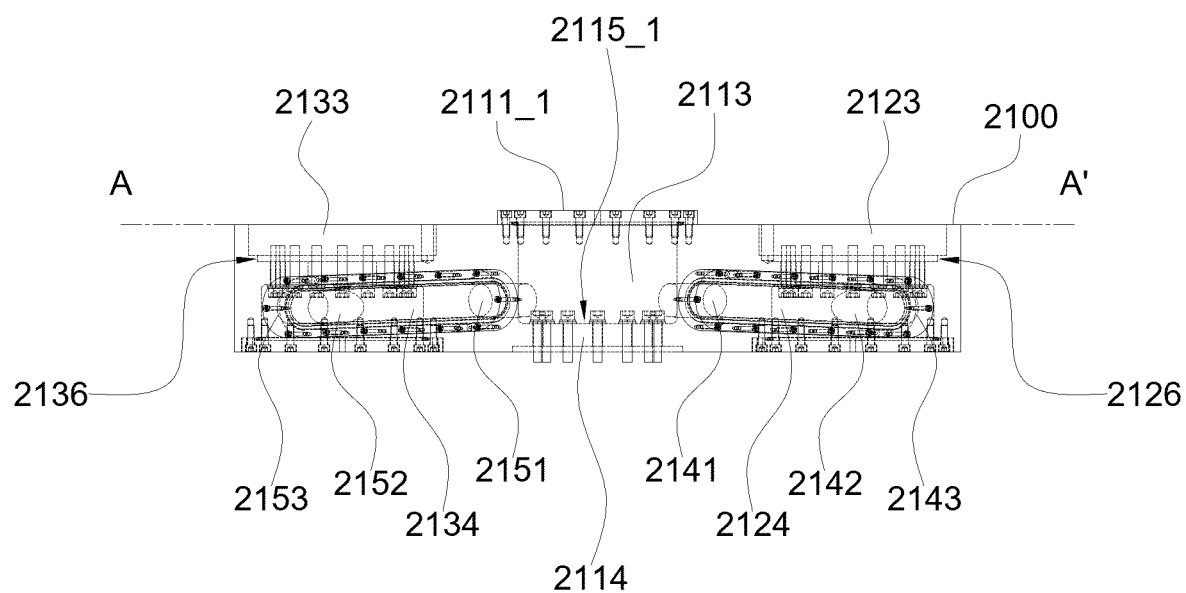

First, referring to FIG. 4A and FIG. 4B, the travel arm platform 2100 can include (i) a (b1_1)-st coupling hole 2110_1 to a (b1_n)-th coupling hole 2110_2 formed in the first straight direction L, (ii) a b2-nd coupling hole 2120 formed through a first one-end area 2101_1 of a second straight direction orthogonal to the first straight direction L and (iii) a b3-rd coupling hole 2130 formed through a first opposite-end area 2101_2 of the second straight direction.

Each of a (b1_1)-st stopping member 2115_1 to a (b1_n)-th stopping member (not shown), through which each of a (b1_1)-st through-hole 2116_1 (shown in FIG. 4C) to a (b1_n)-th through-hole (not shown) corresponding to each of a hollow hole 1203_1 (shown in FIG. 3A) of the first hollow elevating shaft to a hollow hole 1203_2 (shown in FIG. 3A) of the n-th hollow elevating shaft is formed, compartmentalizes each of the (b1_1)-st coupling hole 2110_1 to the (b1_n)-th coupling hole 2110_2 into each of a (b1_1)-st upper space 2113 to a (b1_n)-th upper space (not shown) and each of a (b1_1)-st lower space (not shown) to a (b1_n)-th lower space (not shown). Herein, each of the (b1_1)-st upper space 2113 to the (b1_n)-th upper space (not shown) may be sealed by each of a (b1_1)-st cover 2111_1 to a (b1_n)-th cover 2111_2.

Further, a b2-nd stopping member 2126, through which a b2-nd through-hole 2127 (shown in FIG. 4C) is formed, compartmentalizes the b2-nd coupling hole 2120 into a b2-nd upper space 2123 and a b2-nd lower space 2124. Herein, the b2-nd lower space 2124 is sealed by a b2-nd cover 2121.

Also, a b3-rd stopping member 2136, through which a b3-rd through-hole 2137 (shown in FIG. 4C) is formed, compartmentalizes the b3-rd coupling hole 2130 into a b3-rd upper space 2133 and a b3-rd lower space 2134. Herein, the b3-rd lower space 2134 is sealed by a b3-rd cover 2131.

Moreover, the travel arm platform 2100 may be coupled with the elevating robot. In detail, on condition that each of the opposite ends of the first hollow elevating shaft to the n-th hollow elevating shaft has inserted into each of the (b1_1)-st lower space 2114 to the (b1_n)-th lower space of the (b1_1)-st coupling hole 2110_1 to the (b1_n)-th coupling hole 2110_2, each of the opposite ends of the first hollow elevating shaft to the n-th hollow elevating shaft may be fixedly coupled with each of the (b1_1)-st stopping member 2115_1 to the (b1_n)-th stopping member (not shown).

In case each of the opposite ends of the first hollow elevating shaft to n-th hollow elevating shaft is fixedly coupled with each of the (b1_1)-st stopping member 2115_1 to the (b1_n)-th stopping member (not shown), sealing performance at the fixedly coupled area may be improved by adding sealing members such as O-rings and gaskets, etc. Since the configuration of adding the sealing members, such as the O-rings, the gaskets, etc., may be similarly applied to other coupling parts to be described hereinafter, a description thereon is omitted in the following description of the present disclosure. Through this, external environment may be sealed from vacuum circumstances of the vacuum chamber at the (b1_1)-st coupling hole 2110_1 to the (b1_n)-th coupling hole 2110_2.

Meanwhile, wiring holes configured to insert the wiring (introduced through the hollow hole of at least one of the first hollow elevating shaft to the n-th hollow elevating shaft) into the first travel arm part 2200 and the second travel arm part 2300 can be formed in the travel arm platform 2100.

In other words, a (1_1)-st wiring hole 2141 configured to connect from a one-side surface of a body of the travel arm platform 2100 to a (b1_k)-th upper space 2113 (in FIG. 4A and FIG. 4B, it is assumed that the (b1_k)-th upper space is the (b1_1)-st upper space) which is one of the (b1_1)-st upper space to the (b1_n)-th upper space; a (2_1)-st wiring hole 2142 configured to connect from the one-side surface of the body of the travel arm platform 2100 to the b2-nd lower space 2124; a (1_2)-nd wiring hole 2151 configured to connect from an opposite-side surface of the body of the travel arm platform 2100, which is symmetrical to the one-side of the body of the travel arm platform 2100 based on the first straight direction L, to the (b1_k)-th upper space 2113; and a (2_2)-nd wiring hole 2152 configured to connect from the opposite-side surface of the body of the travel arm platform 2100 to the b3-rd lower space 2134; may be formed.

Also, for sealing the wiring holes, a first sealing cover 2143 configured to seal the (1_1)-st wiring hole 2141 and the (2_1)-st wiring hole 2142 on the one-side surface of the body of the travel arm platform 2100; and a second sealing cover 2153 configured to seal the (1_2)-nd wiring hole 2151 and the (2_2)-nd wiring hole 2152 on the opposite-side surface of the body of the travel arm platform 2100; may be installed.

Figure 4C:
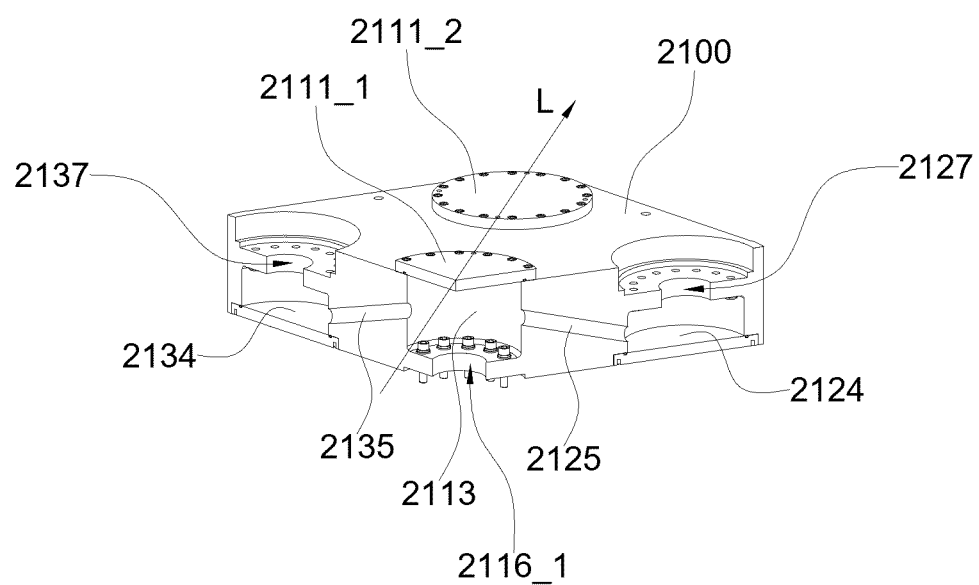

In addition, referring to FIG. 4C, for another example, wiring holes configured to insert the wiring (introduced through the hollow hole of at least one of the first hollow elevating shaft to the n-th hollow elevating shaft) into the first travel arm part 2200 and the second travel arm part 2300 may be formed inside the body of the travel arm platform 2100.

In other words, within the travel arm platform 2100, the first wiring hole 2125 configured to connect the (b1 k)-th upper space 2113 (in FIG. 4C, it is assumed that the (b1_k)-th upper space is the (b1_1)-st upper space) which is one of the (b1_1)-st upper space to the (b1_n)-th upper space with the b2-nd lower space 2124 may be formed, and the second wiring hole 2135 configured to connect the b1_k-th upper space 2113 with the b3-rd lower space 2134 may be formed. Accordingly, the travel arm platform 2100 can be sealed without an additional sealing member.

Next, referring to FIG. 2B again, the b2-nd coupling hole 2120 of the travel arm platform 2100 can be coupled with a (1_1)-st travel link arm 2210 of the first travel arm part 2200, and the b3-rd coupling hole 2130 of the travel arm platform 2100 can be coupled with a (2_1)-st travel link arm 2310 of the second travel arm part 2300.

Figure 5:
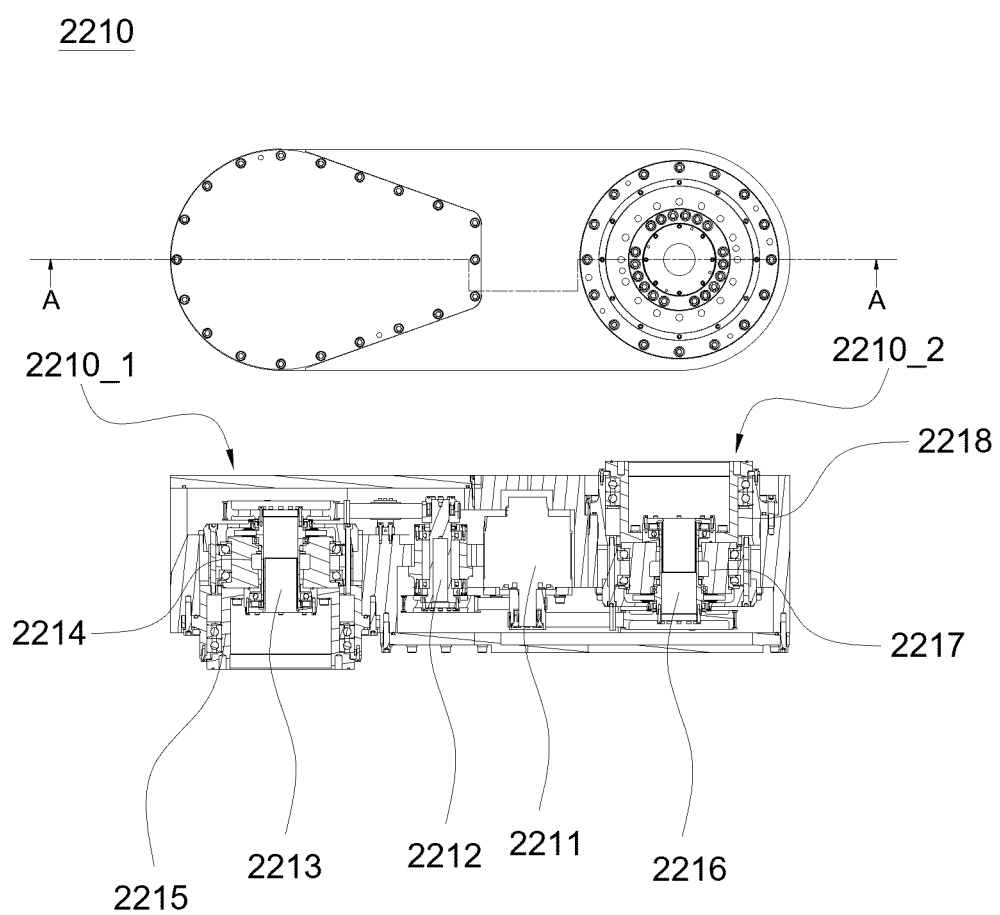
FIG. 5 is a drawing schematically illustrating a (1_1)-st travel link arm of the travel robot in the substrate transfer apparatus in accordance with one example embodiment of the present disclosure.

Herein, referring to FIG. 5, the (1_1)-st travel link arm 2210 of the first travel arm part 2200 has a sealed inner space where a first travel driving motor 2211 and a first speed reducer 2212 are installed, wherein the first speed reducer 2212 is interlocked with the first travel driving motor 2211 to reduce a rotational speed of the first travel driving motor by half.

Also, a (1_1)-st hollow driving shaft 2213 interlocked with the first speed reducer 2212 and a (1_1)-st output shaft 2214 interlocked with the (1_1)-st hollow driving shaft 2213 may be sealingly installed on the (1_1)-st one-end area 2210_1 of the (1_1)-st travel link arm 2210, and a (1_2)-nd hollow driving shaft 2216 interlocked with the first travel driving motor 2211 and a (1_2)-nd output shaft 2217 interlocked with the (1_2)-nd hollow driving shaft 2216 may be sealingly installed on a (1_1)-st opposite-end area 2210_2 of the (1_1)-st travel link arm 2210. Herein, the interlocking between the first travel driving motor 2211 and the first speed reducer 2212, the interlocking between the first speed reducer 2212 and the (1_1)-st hollow driving shaft 2213, and the interlocking between the first travel driving motor 2211 and the (1_2)-nd hollow driving shaft 2216 may be achieved by pulley method, respectively, but the present disclosure is not limited thereto. For example, various methods, such as a method of using gears, etc. may be adopted to transmit a rotational force. Also, not only the (1_1)-st hollow driving shaft 2213 with the (1_1)-st output shaft 2214 but also the (1_2)-nd hollow driving shaft 2216 with the (1_2)-nd output shaft 2217 can be formed by speed reducers each of which has a same reduction ratio. In addition, the (1_1)-st output shaft 2214 and the (1_2)-nd output shaft 2217 can be driven with opposite rotation directions. Also, the (1_1)-st output shaft 2214 installed on the (1_1)-st one-end area of the (1_1)-st travel link arm 2210 of the first travel arm part 2200 may be inserted into the b2-nd upper space 2123 of the b2-nd coupling hole 2120 of the travel arm platform 2100, to thereby be fixedly coupled with the b2-nd stopping member.

Herein, a (1_1)-st linking member 2215 is a tube-shaped shaft and may be used for coupling the (1_1)-st output shaft 2214 with the b2-nd stopping member, and each of the two-ends of the (1_1)-st linking member 2215 can be fixedly coupled with each of the (1_1)-st output shaft 2214 and the b2-nd stopping member. Herein, the length of the (1_1)-st linking member 2215 is same as or larger than a distance between the (1_1)-st output shaft 2214 and the b2-nd stopping member, specifically at the position where the travel arm platform 2100 is coupled with the (1_1)-st travel link arm 2210.

In addition, the (2_1)-st travel link arm 2310 of the second travel arm unit 2300 may be configured similarly to the (1_1)-st travel link arm 2210 of the first travel arm part 2200 described with reference to FIG. 5.

That is, the (2_1)-nd travel link arm 2310 of the second travel arm part 2300 has a sealed inner space where a second travel driving motor and a second speed reducer are installed, wherein the second speed reducer is interlocked with the second travel driving motor to reduce a rotational speed of the second travel driving motor by half.

Also, a (2_1)-st hollow driving shaft interlocked with the second speed reducer and a (2_1)-st output shaft interlocked with the (2_1)-st hollow driving shaft may be sealingly installed on a (2_1)-st one-end area of the (2_1)-st travel link arm 2310, and a (2_2)-nd hollow driving shaft interlocked with the second travel driving motor and a (2_2)-nd output shaft interlocked with the (2_2)-nd hollow driving shaft may be sealingly installed on a (2_1)-st opposite-end area of the (2_1)-st travel link arm 2310. Herein, the interlocking between the second travel driving motor and the second speed reducer, the interlocking between the second speed reducer and the (2_1)-st hollow driving shaft, and the interlocking between the second travel driving motor and the (2_2)-nd hollow driving shaft may be achieved by pulley method, respectively, but the present disclosure is not limited thereto. For example, various methods, such as a method of using gears, etc. may be adopted to transmit a rotational force. Also, not only the (2_1)-st hollow driving shaft with the (2_1)-st output shaft but also the (2_2)-nd hollow driving shaft with the (2_2)-nd output shaft can be formed by speed reducers each of which has a same reduction ratio. In addition, the (2_1)-st output shaft and the (2_2)-nd output shaft can be driven with opposite rotation directions.

Also, the (2_1)-st output shaft installed on the (2_1)-st one-end area of the (2_1)-st travel link arm 2310 of the second travel arm part 2300 may be inserted into the b3-rd upper space of the b3-rd coupling hole 2130 of the travel arm platform, to thereby be fixedly coupled with the b3-rd stopping member.

Herein, a (1_2)-nd linking member is a tube-shaped shaft and may be used for coupling the (2_1)-st output shaft with the b3-rd stopping member, and each of the two-ends of the (1_2)-nd linking member can be fixedly coupled with each of the (2_1)-st output shaft and the b3-rd stopping member. Herein, the length of the (1_2)-nd linking member is same as or larger than a distance between the (2_1)-st output shaft and the b3-rd stopping member, specifically at the position where the travel arm platform 2100 is coupled with the (2_1)-st travel link arm 2310.

Next, a (1_2)-nd one-end area 2220_1 of the (1_2)-nd travel link arm 2220 may be fixedly coupled with the (1_2)-nd output shaft 2217 of the (1_1)-st travel link arm 2210 of the first travel arm part 2200, and a (2_2)-nd one-end area 2320_1 of the (2_2)-nd travel link arm 2320 may be fixedly coupled with the (2_2)-nd output shaft of the (2_1)-st travel link arm 2310 of the second travel arm part 2300.

Herein, a linking member is a tube-shaped shaft and may be used for coupling the (1_2)-nd output shaft 2217 with the (1_2)-nd one-end area, and each of the two-ends of the linking member 2218 can be fixedly coupled with each of the (1_2)-nd output shaft 2217 and the (1_2)-nd one-end area. Herein, the length of the linking member 2218 is same as or larger than a distance between the (1_2)-nd output shaft 2217 and the (1_2)-nd one-end area, specifically at the position where the (1_1)-st travel link arm 2210 is coupled with the (1_2)-nd travel link arm 2220.

Also, a linking member is a tube-shaped shaft and may be used for coupling the (2_2)-nd output shaft with the (2_2)-nd one-end area, and each of the two-ends of the linking member can be fixedly coupled with each of the (2_2)-nd output shaft and the (2_2)-nd one-end area. Herein, the length of the linking member is same as or larger than a distance between the (2_2)-nd output shaft and the (2_2)-nd one-end area, specifically at the position where the (2_1)-st travel link arm 2310 is coupled with the (2_2)-nd travel link arm 2320.

Next, referring to FIG. 2B again, the transfer robot coupling part 2400 may be coupled with the (1_2)-nd travel link arm 2220 and the (2_2)-nd travel link arm 2320.

In other words, a second one-end area 2401_1 of the transfer robot coupling part 2400 is rotatably coupled with a (1_2)-nd opposite-end area 2220_2 of the (1_2)-nd travel link arm 2220, and a second opposite-end area 2401_2 of the transfer robot coupling part 2400 is rotatably coupled with a (2_2)-nd opposite-end area 2320_2 of the (2_2)-nd travel link arm 2320.

Also, a rotation driving motor (not shown) including a rotation driving shaft 2410 having a hollow hole therethrough may be sealingly formed at a first center area of the transfer robot coupling part 2400, and the transfer robot 3000 configured to transfer the substrate may be sealingly coupled with the rotation driving shaft 2410 having a hollow hole therethrough.

In addition, a compliance 2420 may be configured to change, within the transfer robot coupling part 2400, any one of a position where the (1_2)-nd opposite-end area of the (1_2)-nd travel link arm 2220 is rotatably coupled and a position where the (2_2)-nd opposite-end area of the (2_2)-nd travel link arm 2320 is rotatably coupled, in response to an external force. Herein, the compliance 2420 is installed in any one end area of the second one-end area and the second opposite-end area.

Figure 6:
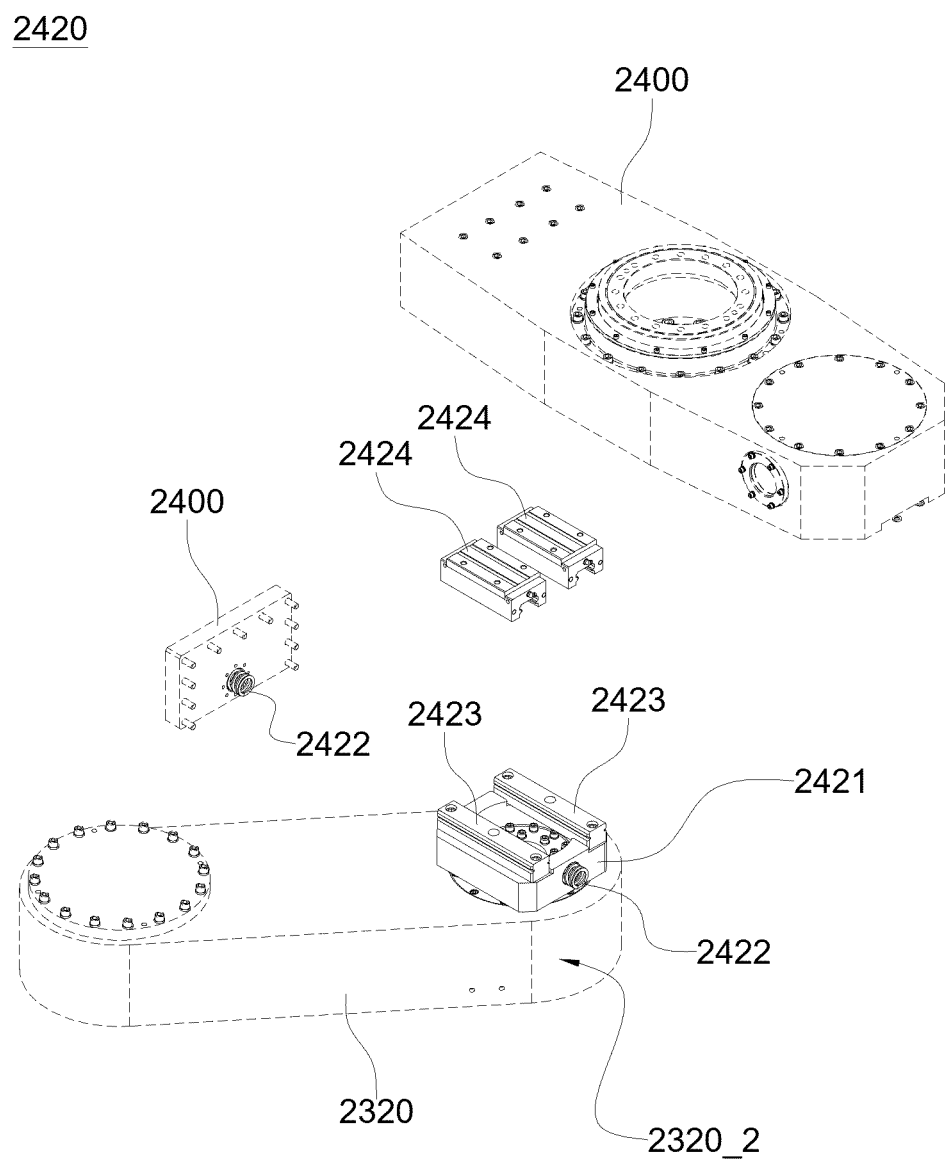
FIG. 6 is a drawing schematically illustrating a compliance of the travel robot in the substrate transfer apparatus in accordance with one example embodiment of the present disclosure.

Herein, referring to FIG. 6, the compliance 2420 can include a compliance body 2421, which is formed inside of any one of the second one-end area and the second opposite-end area of the transfer robot coupling part 2400. Further, a lower surface of the compliance body 2421 can be rotatably coupled with any one of the (1_2)-nd opposite-end area of the (1_2)-nd travel link arm 2220 and the (2_2)-nd opposite-end area 2320_2 of the (2_2)-nd travel link arm 2320, and FIG. 6 illustrates a state of the compliance body 2421 being rotatably coupled with the (2_2)-nd travel link arm 2320. Also, the compliance body 2421 is movably formed in a longitudinal direction of the transfer robot coupling part 2400 within any one of the second one-end area and the second opposite-end area of the transfer robot coupling part 2400.

Meanwhile, at least one first sliding member 2423 may be formed on an upper surface of the compliance body 2421 along a longitudinal direction of the transfer robot coupling part 2400.

Further, a second sliding member 2424 may be coupled with the first sliding member 2423. Herein, a lower surface of the second sliding member 2424 is coupled with the first sliding member to be slid in the longitudinal direction of the transfer robot coupling part 2400 and an upper surface of the second sliding member 2424 is fixedly coupled with the transfer robot coupling part 2400.

In addition, the compliance 2420 can be configured with the elastic members 2422 respectively formed in both sides of a moving path of the compliance body 2421 within any one of the second one-end area and the second opposite-end area of the transfer robot coupling part 2400. However, as another example, the compliance 2420 according to the present disclosure may be implemented in various ways such as a cylinder shape using hydraulic pressure, other than a configuration using the elastic members.

Figure 7:
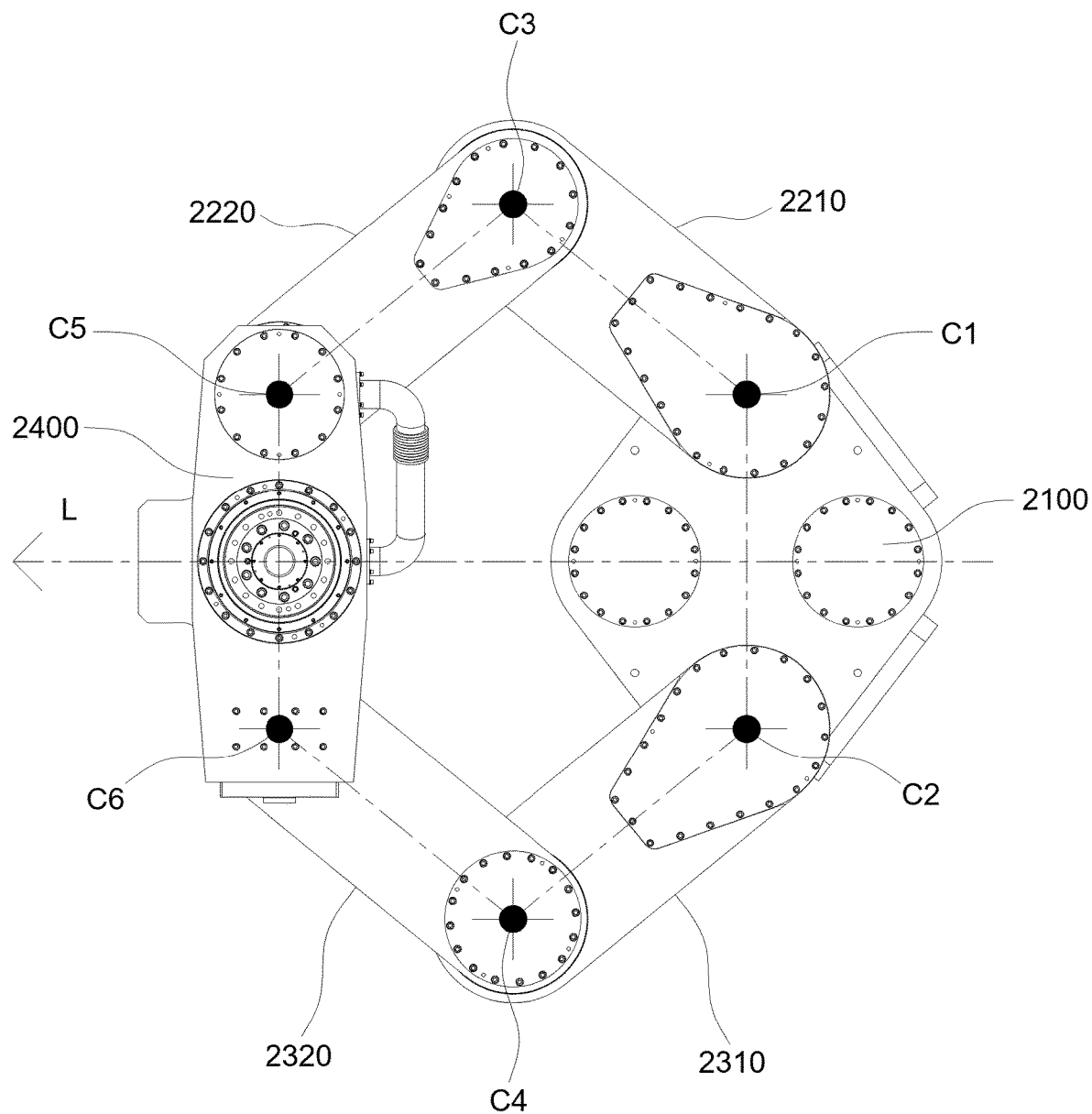
FIG. 7 is a drawing schematically illustrating link arms of the travel robot in the substrate transfer apparatus in accordance with one example embodiment of the present disclosure.

Meanwhile, referring to FIG. 7, it may be provided with a (1_1)-st intersection point C1, a (1_2)-nd intersection point C2, a (2_1)-st intersection point C3, a (2_2)-nd intersection point C4, a (3_1)-st intersection point C5 and a (3_2)-nd intersection point C6, wherein the (1_1)-st intersection point C1 is a point at which a second straight direction line, connecting a center point of the b2-nd coupling hole (which corresponds to 2120 in FIG. 5A) and a center point of the b3-rd coupling hole (which corresponds to 2130 in FIG. 5A) of the travel arm platform 2100, and a longitudinal center line of the (1_1)-st travel link arm 2210 intersect, wherein the (1_2)-nd intersection point C2 is a point at which the second straight direction line and a longitudinal center line of the (2_1)-st travel link arm 2310 intersect, wherein the (2_1)-st intersection point C3 is a point at which the longitudinal center line of the (1_1)-st travel link arm 2210 and a longitudinal center line of the (1_2)-nd travel link arm 2220 intersect, wherein the (2_2)-nd intersection point C4 is a point at which the longitudinal center line of the (2_1)-st travel link arm 2310 and a longitudinal center line of the (2_2)-nd travel link arm 2320 intersect, wherein the (3_1)-st intersection point C5 is a point at which the longitudinal center line of the (1_2)-nd travel link arm 2220 and a longitudinal center line of the transfer robot coupling part 2400 intersect, and wherein the (3_2)-nd intersection point C6 is a point at which the longitudinal center line of the (2_2)-nd travel link arm 2320 and the longitudinal center line of the transfer robot coupling part 2400 intersect, and wherein a distance between the (1_1)-st intersection point C1 and the (1_2)-nd intersection point C2 and a distance between the (3_1)-st intersection point C5 and the (3_2)-nd intersection point C6 are determined as same with each other. Also, a distance between the (1_1)-st intersection point C1 and the (2_1)-st intersection point C3, a distance between the (2_1)-st intersection point C3 and the (3_1)-st intersection point C5, a distance between the (1_2)-nd intersection point C2 and the (2_2)-nd intersection point C4 and a distance between the (2_2)-nd intersection point C4 and the (3_2)-nd intersection point C6 are determined as same with each other.

In addition, an absolute value of an angle formed between the travel arm platform 2100 and the (1_1)-st travel link arm 2210 at the (1_1)-st intersection point C1 is determined as same with an absolute value of an angle formed between the travel arm platform 2100 and the (2_1)-st travel link arm 2310 at the (1_2)-nd intersection point C2, an absolute value of an angle formed between the (1_1)-st travel link arm 2210 and the (1_2)-nd travel link arm 2220 at the (2_1)-st intersection point C3 is determined as same with an absolute value of an angle formed between the (2_1)-st travel link arm 2310 and the (2_2)-nd travel link arm 2320 at the (2_2)-nd intersection point C4, and an absolute value of an angle formed between the (1_2)-nd travel link arm 2220 and the transfer robot coupling part 2400 at the (3_1)-st intersection point C5 is determined as same with an absolute value of an angle formed between the (2_2)-nd travel link arm 2320 and the transfer robot coupling part 2400 at the (3_2)-nd intersection point C6.

Through this, the travel robot 2000 can move the transfer robot 3000 supported by the transfer robot coupling part 2400 forward or backward along the first straight direction.

Herein, the first travel driving motor 2211 installed in the (1_1)-st travel link arm 2210 and the second travel driving motor installed in the (2_1)-st travel link arm 2310 may operate in the same manner but with opposite rotation directions.

Also, a first wiring for the operation of the first travel driving motor 2211 and a second wiring for the operation of the second travel driving motor can be placed in sealed spaces inside the travel robot 2000.

Herein, the first wiring may be introduced into the first travel driving motor 2211 through each hollow holes of at least one of the hollow elevating shafts and the (1_1)-st hollow driving shaft 2213 so as to prevent the first wiring from being exposed to an inner space of the vacuum chamber, and the second wiring may be introduced into the second travel driving motor through each hollow holes of at least one of the hollow elevating shafts and the (2_1)-st hollow driving shaft so as to prevent the second wiring from being exposed to an inner space of the vacuum chamber. Meanwhile, the first wiring and the second wiring may be respectively branched from at least one of the hollow elevating shafts into the first travel arm part 2200 and the second travel arm part 2300 through the wiring holes formed in the travel arm platform 2100.

Next, the transfer robot 3000 of the substrate transfer apparatus in accordance with one example embodiment of the present disclosure is as follows.

Figure 8A:
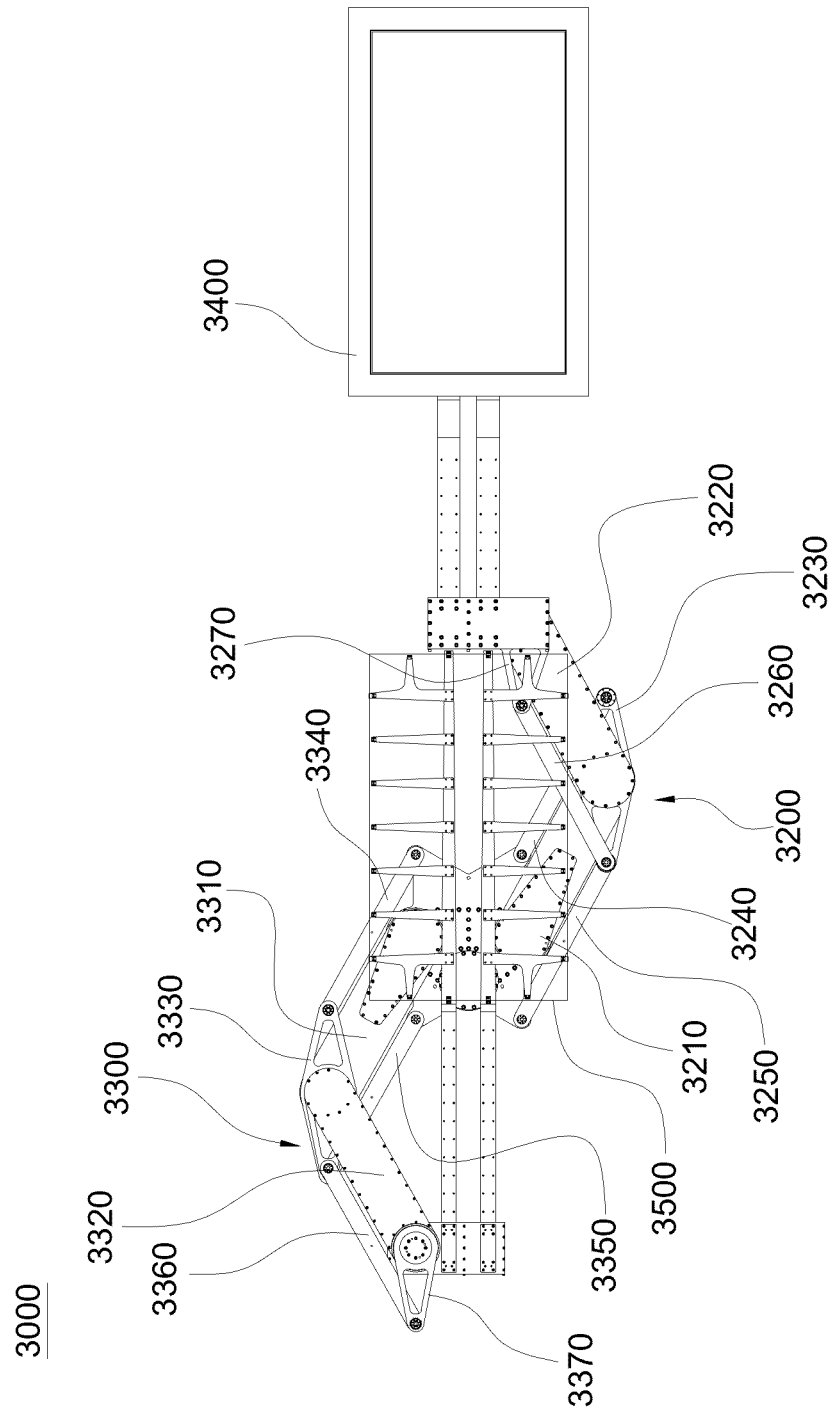
FIG. 8A and FIG. 8B are drawings schematically illustrating a transfer robot in the substrate transfer apparatus in accordance with one example embodiment of the present disclosure.
Figure 8B:
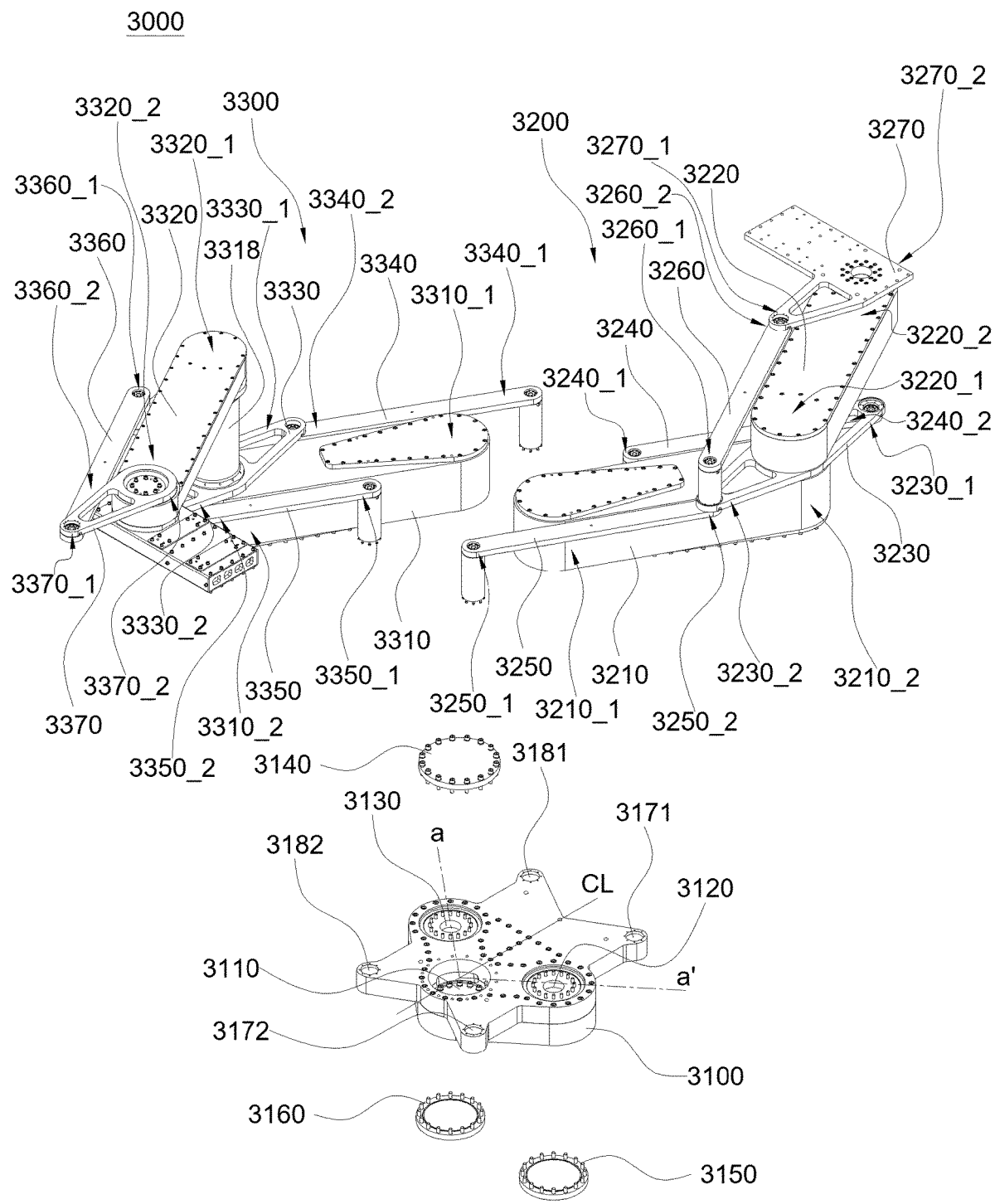

Referring to FIG. 8A and FIG. 8B, the transfer robot 3000 includes a transfer arm platform 3100, a first transfer arm part 3200 and a second transfer arm part 3300, wherein the transfer arm platform 3100 is coupled with the transfer robot coupling part 2400 of the travel robot 2000, wherein the first transfer arm part 3200 and the second transfer arm part 3300 are coupled with the transfer arm platform 3100, and wherein each of the first transfer arm part 3200 and the second transfer arm part 3300 are coupled with each of a first end-effector 3400 and a second end-effector 3500 configured to support the substrate.

For reference, FIG. 8A illustrates a state in which a mask as a substrate is supported by the first end-effector 3400 and a glass substrate is supported by the second end-effector 3500, and FIG. 8B illustrates a state in which forks capable of supporting the substrates in the first end-effector 3400 and the second end-effector 3500 are omitted.

Through this, the transfer robot 3000 may be moved to a particular location within the vacuum chamber by operations of the first travel arm part and the second travel arm part of the travel robot. Further, on condition that the first end-effector 3400 or the second end-effector 3500 is located at a loading position or an unloading position of the substrate by the vertical movement of the elevating robot, the first end-effector 3400 or the second end-effector 3500 may load or unload the substrate according to the operations of the first transfer arm part 3200 or the second transfer arm part 3300.

Further, the transfer arm platform 3100 may include a c1-st coupling hole 3110 formed at a second center area which is a specific area on the center line CL, wherein the center line CL compartmentalize the transfer arm platform 3100 based on the linear movement direction of the first transfer arm part 3200 or the second transfer arm part 3300, i.e., based on the linear movement direction of the substrate moved by the transfer robot 3000; a c2-nd coupling hole 3120 formed at a third one-side area which is a one-side area from the center line CL; and a c3-rd coupling hole 3130 formed at a third opposite-side area which is an opposite-side area from the center line CL corresponding to the third one-side area.

Further, in the transfer arm platform 3100, a (1_1)-st blade 3171 and a (1_2)-nd blade 3172 for the link connection are formed respectively at a forward part and a backward part of the c2-nd coupling hole 3120, and a (2_1)-st blade 3181 and a (2_2)-nd blade 3182 for the link connection are formed respectively at the forward part and the backward part of the c3-rd coupling hole 3130. Herein, the forward part corresponds to a direction in which the processing chamber is positioned while the transfer robot 3000 is positioned to transfer the substrate to the processing chamber coupled with the vacuum chamber, and the backward part corresponds to an opposite direction of the forward part.

Figure 9A:
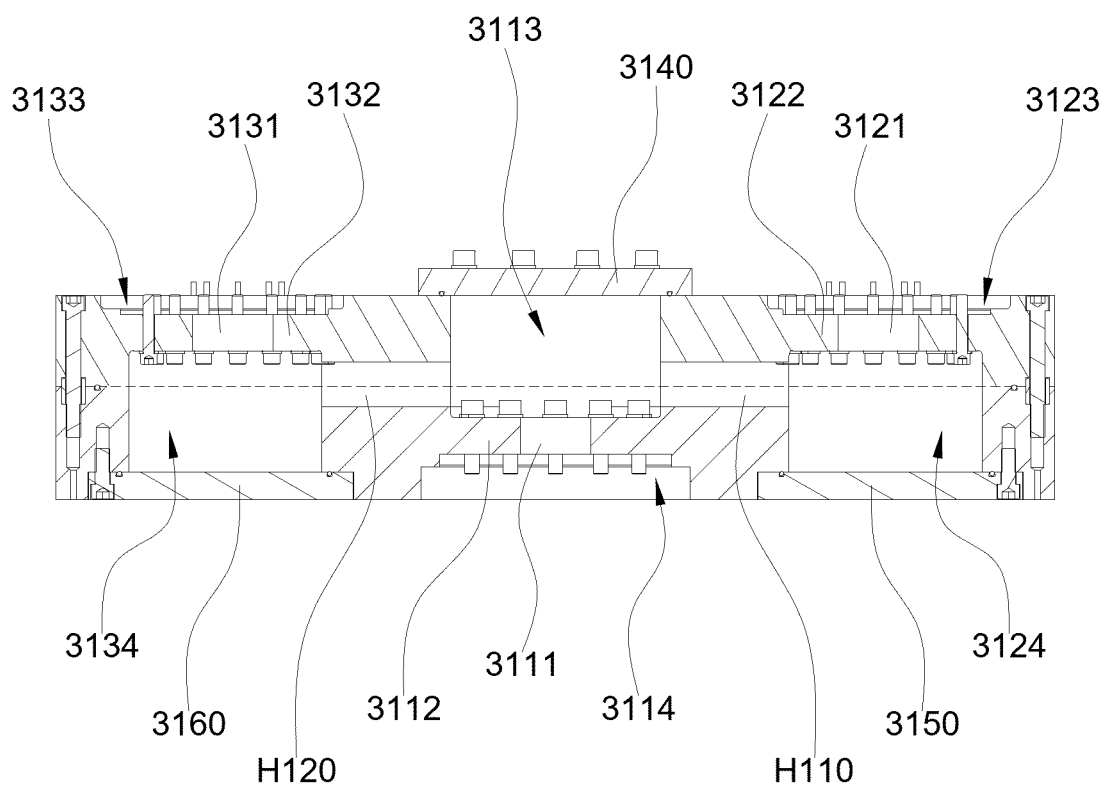
FIG. 9A, FIG. 9B, and FIG. 9C are drawings schematically illustrating a transfer arm platform of the transfer robot in the substrate transfer apparatus in accordance with one example embodiment of the present disclosure.

Herein, referring to FIG. 9A, a c1-st stopping member 3112, through which a c1-st through-hole 3111 corresponding to a hollow hole of a rotation driving shaft of the rotation driving motor of the transfer robot coupling part is formed at the second center area, compartmentalizes the c1-st coupling hole 3110 of the transfer arm platform 3100 into a c1-st upper space 3113 sealed by a c1-st cover 3140 and a c1-st lower space 3114.

In addition, a c2-nd stopping member 3122, through which a c2-nd through-hole 3121 is formed at a third one-side area, compartmentalize the c2-nd coupling hole 3120 of the transfer arm platform 3100 into a c2-nd upper space 3123 and a c2-nd lower space 3124 which is sealed by a c2-nd cover 3150.

Further, a c3-rd stopping member 3132, through which a c3-rd through-hole 3131 is formed at a third opposite-side area, compartmentalizes the c3-rd coupling hole 3130 of the transfer arm platform 3100 into a c3-rd upper space 3133 and a c3-rd lower space 3134 which is sealed by a c3-rd cover 3160.

Also, the transfer arm platform 3100 may include wiring holes for introducing wiring to the first transfer arm part 3200 and the second transfer arm part 3300. Herein, the wiring is introduced through the hollow hole of the rotation driving shaft of the travel robot described above.

In other words, the transfer arm platform 3100 may include (i) a third wiring hole H110 connecting the c1-st upper space 3113 and the c2-nd lower space 3124 and (ii) a fourth wiring hole H120 connecting the c1-st upper space 3113 and the c3-rd lower space 3134.

Figure 9B:
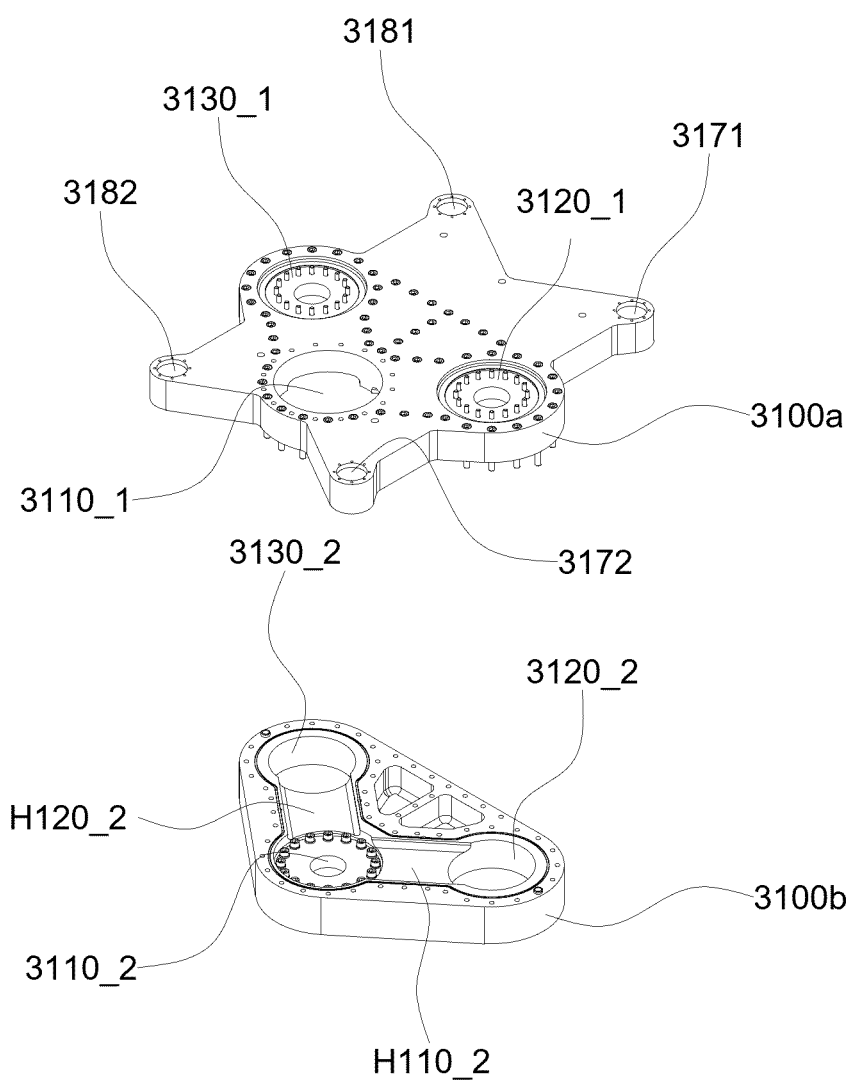
Figure 9C:
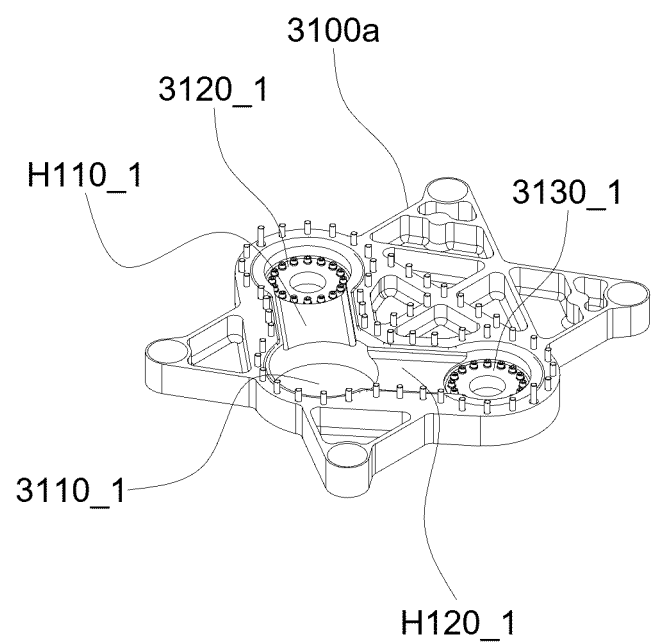

For an example, referring to FIG. 9B and FIG. 9C in addition to the FIG. 9A, the transfer arm platform 3100 may be formed by combining an upper plate 3100a and a lower plate 3100b with each other, wherein the upper plate 3100a includes the (1_1)-st blade 3171, the (1_2)-nd blade 3172, (2_1)-st blade 3181 and the (2_2)-nd blade 3182.

A c1-st upper coupling hole 3110_1, which is a part of the c1-st coupling hole, is formed at the second central area of the upper plate 3100a, a c2-nd upper coupling hole 3120_1, which is a part of the c2-nd coupling hole, is formed at the third one-side area of the upper plate 3100a, and a c3-rd upper coupling hole 3130_1, which is a part of the c3-rd coupling hole, is formed at the third opposite-side area of the upper plate 3100a.

Further, a c2-nd stopping member 3122, through which the c2-nd through-hole 3121 is formed inside the c2-nd upper coupling hole 3120_1, compartmentalize the inner space of the c2-nd upper coupling hole 3120_1, and a c3-rd stopping member 3132, through which the c3-rd through-hole 3131 is formed inside the c3-rd upper coupling hole 3130_1, compartmentalize the inner space of the c3-rd upper coupling hole 3130_1.

Also, a third upper wiring slot H110_1 and a fourth upper wiring slot H120_1 are formed in a lower part of the upper plate 3100a, wherein the third upper wiring slot H1101 connects an inner space of the c1-st upper coupling hole 3110_1 with a lower space of the c2-nd upper coupling hole 3120_1, and the fourth upper wiring slot H120_1 connects the inner space of the c1-st upper coupling hole 3110_1 with a lower space of the c3-rd upper coupling hole 3130_1.

Meanwhile, a c1-st lower coupling hole 3110_2, which is another part of the c1 coupling hole, is formed at the second central area of the lower plate 3100b, and a c2-nd lower coupling hole 3120_2, which is another part of the c2-nd coupling hole, is formed at the third one-side area of the lower plate, and a c3-rd lower coupling hole 3130_2, which is another part of the c3 coupling hole, is formed at the third opposite-side area of the lower plate.

Also, a c1-st stopping member 3112, through which the c1-st through-hole 3111 is formed inside the c1-st lower coupling hole 3110_2, compartmentalize the inner space of the c1-st lower coupling hole 3110_2.

In addition, a third lower wiring slot H110_2 and a fourth lower wiring slot H120_2 are formed in an upper part of the lower plate 3100b, wherein the third lower wiring slot H1102 connects an upper space of the c1-st lower coupling hole 3110_2 with an inner space of the c2-nd lower coupling hole 3120_2, and the fourth lower wiring slot H120_2 connects the upper space of the c1-st lower coupling hole 3110_2 with an inner space of the c3-rd lower coupling hole 3130_2.

Thus, by coupling the upper plate 3100a and the lower plate 3100b, the c1-st upper coupling hole 3110_1 and the c1-st lower coupling hole 3110_2 are combined with each other thereby forming the c1-st coupling hole 3110, the c2-nd upper coupling hole 3120_1 and the c2-nd lower coupling hole 3120_2 are combined with each other thereby forming the c2-nd coupling hole 3120, and the c3-rd upper coupling hole 3130_1 and the c3-rd lower coupling hole 3130_2 are combined with each other thereby forming the c3-rd coupling hole 3130. Also, by coupling the upper plate 3100a and the lower plate 3100b, the third upper wiring slot H110_1 and the third lower wiring slot H110_2 are combined with each other thereby forming the third wiring hole H110, and the fourth upper wiring slot H120_1 and the fourth lower wiring slot H120_2 are combined with each other thereby forming the fourth wiring hole H120.

Referring FIG. 8A and FIG. 8B again, the transfer arm platform 3100 may be coupled with the travel robot. In detail, the rotation driving shaft of the rotation driving motor of the travel robot may be inserted into the c1-st lower space of the c1-st coupling hole 3110, thereby allowing the rotation driving shaft to be fixedly coupled with the c1-st stopping member. Herein, when the rotation driving shaft is fixedly coupled with the c1-st stopping member, a sealing performance at a coupling area may be improved by adding the sealing members such as the O-rings, the gaskets, etc. Since the configuration of adding the sealing members, such as the O-rings, the gaskets, etc., may be similarly applied to other coupling parts to be described hereinafter, a description thereon is omitted in the following description of the present disclosure.

Accordingly, exposure to an external environment through the hollow hole of the rotation driving shaft may be sealed away, at the c1-st coupling hole 3110, from the vacuum environment of the inside of the vacuum chamber.

Also, the (1_1)-st transfer link arm 3210 of the first transfer arm part 3200 can be coupled with the c2-nd coupling hole 3120 of the transfer arm platform 3100, and the (2_1)-st transfer link arm 3310 of the second transfer arm part 3300 can be coupled with the c3-rd coupling hole 3130 of the transfer arm platform 3100.

Figure 10:
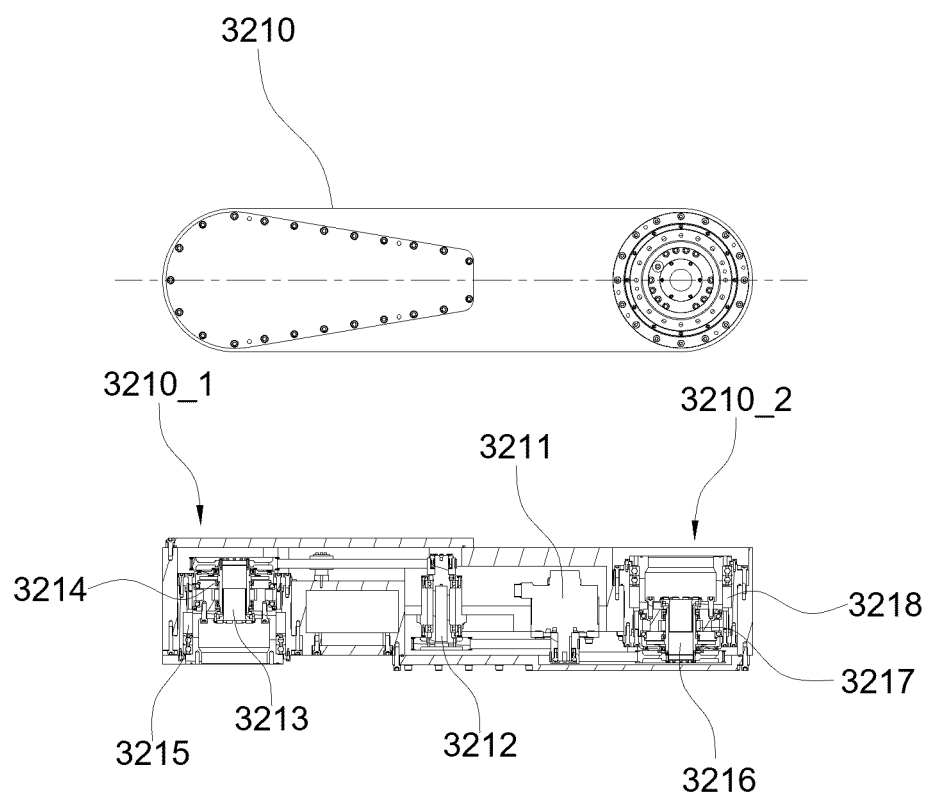
FIG. 10 is a drawing schematically illustrating a (1_1)-st transfer link arm of the transfer robot in the substrate transfer apparatus in accordance with one example embodiment of the present disclosure.

Herein, referring to FIG. 10, the (1_1)-st transfer link arm 3210 of the first transfer arm part 3200 has a sealed inner space where the first transfer driving motor 3211 and the third speed reducer 3212 are installed, wherein the third speed reducer 3212 is interlocked with the first transfer driving motor 3211 to reduce a rotational speed of the first transfer driving motor by half.

Also, a (3_1)-st hollow driving shaft 3213 interlocked with the third speed reducer and a (3_1)-st output shaft 3214 interlocked with the (3_1)-st hollow driving shaft 3213 may be sealingly installed on a (3_1)-st one-end area 3210_1 of the (1_1)-st transfer link arm 3210, and a (3_2)-nd hollow driving shaft 3216 interlocked with the first transfer driving motor 3211 and a (3_2)-nd output shaft 3217 interlocked with the (3_2)-nd hollow driving shaft 3216 may be sealingly installed on a (3_1)-st opposite-end area 3210_2 of the (1_1)-st transfer link arm 3210. Herein, the interlocking between the first transfer driving motor 3211 and the third speed reducer 3212, the interlocking between the third speed reducer 3212 and the (3_1)-st hollow driving shaft 3213, and the interlocking between the first transfer driving motor 3211 and the (3_2)-nd hollow driving shaft 3216 may be achieved by pulley method, respectively, however, the present disclosure is not limited thereto. For example, various methods, such as a method using gears, etc. may be adopted to transmit a rotational force. Also, not only the (3_1)-st hollow driving shaft 3213 with the (3_1)-st output shaft 3214 but also the (3_2)-nd hollow driving shaft 3216 with the (3_2)-nd output shaft 3217 can be formed by speed reducers each of which has a same reduction ratio. In addition, the (3_1)-st output shaft 3214 and the (3_2)-nd output shaft 3217 can be driven with opposite rotation directions.

Referring FIG. 8A and FIG. 8B again, the (3_1)-st output shaft may be inserted into the c2-nd upper space of the c2-nd coupling hole 3120 of the transfer arm platform 3100 to thereby be fixedly coupled with the c2-nd stopping member. Herein the (3_1)-st output shaft is installed on a (3_1)-st one-end area 3210_1 of the (1_1)-st transfer link arm 3210 of the first transfer arm part 3200.

Herein, a (2_1)-st linking member (corresponding to 3125 in FIG. 10) is a tube-shaped shaft and may be used for coupling the (3_1)-st output shaft with the c2-nd stopping member, and each of the two-ends of the (2_1)-st linking member can be fixedly coupled with each of the (3_1)-st output shaft and the c2-nd stopping member. Herein, the length of the (2_1)-st linking member is same as or larger than a distance between the (3_1)-st output shaft and the c2-nd stopping member, specifically at the position where the transfer arm platform 3100 is coupled with the (1_1)-st transfer link arm 3210.

Also, a (3_2)-nd output shaft of the (1_1)-st transfer link arm 3210 of the first transfer arm part 3200 may be fixedly coupled with a (3_2)-nd one-end area 3220_1 of the (1_2)-nd transfer link arm 3220.

Herein, a first fixed coupling shaft (corresponding to 3128 in FIG. 10) is a tube-shaped shaft and may be used for coupling the (3_2)-nd output shaft of the (1_1)-st transfer link arm 3210 with the (3_2)-nd one-end area 3220_1 of the (1_2)-nd transfer link arm 3220, and each of the two-ends of the first fixed coupling shaft can be fixedly coupled with each of the (3_2)-nd output shaft and the (3_2)-nd one-end area 3220_1.

Herein, the length of the first fixed coupling shaft is same as or larger than a distance between the (3_2)-nd output shaft and the (3_2)-nd one-end area 3220_1, specifically at the position where the (1_1)-st transfer link arm 3210 is coupled with the (1_2)-nd transfer link arm 3220.

Also, a first common link arm 3230 may be installed at a location where the (1_1)-st transfer link arm 3210 and the (1_2)-nd transfer link arm 3220 are coupled, in other words, at a location where the (3_2)-nd output shaft and the (3_2)-nd one-end area 3220_1 are coupled.

Figure 11:
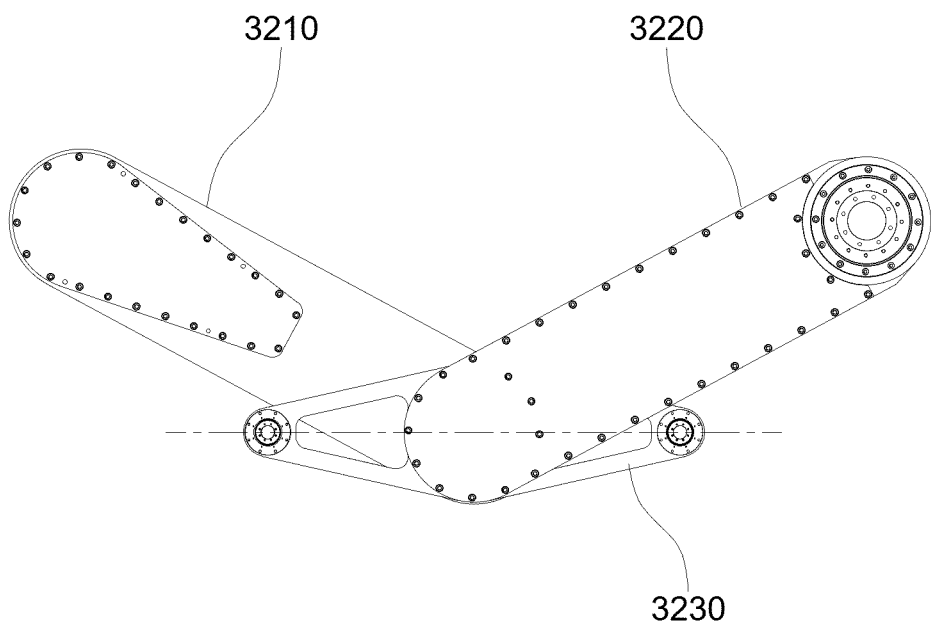
FIG. 11 is a drawing schematically illustrating a connecting part between the (1_1)-st transfer link arm and a (1_2)-nd transfer link arm of the transfer robot in the substrate transfer apparatus in accordance with one example embodiment of the present disclosure.
Figure 11:
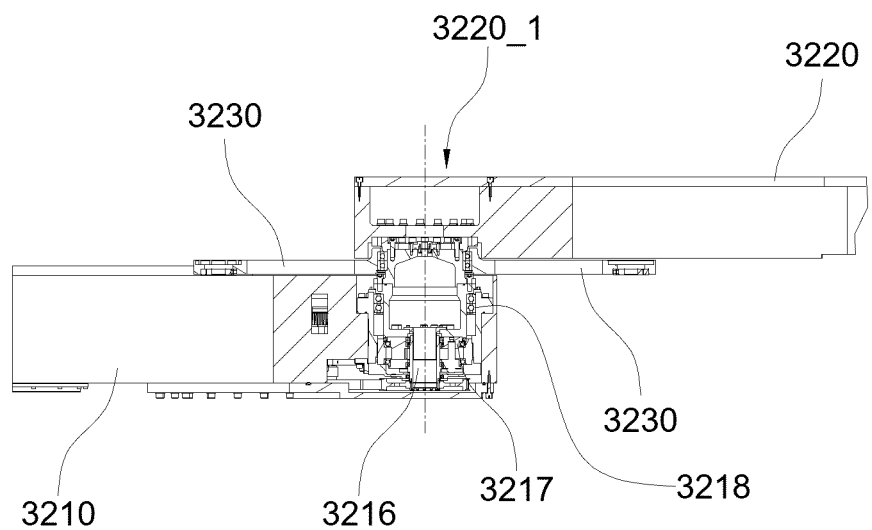

That is, by referring to FIG. 11, a third center area of the first common link arm 3230 may be rotatably coupled with the first fixed coupling shaft 3218, wherein the first fixed coupling shaft 3218 combines the (3_2)-nd output shaft 3217 with the (3_2)-nd one-end area 3220_1.

Also, by referring to FIG. 8A and FIG. 8B again, the first transfer arm part 3200 may include a (1_1)-st subordinate link arm 3240 that is parallel to the (1_1)-st transfer link arm 3210, wherein a (3_4)-th one-end area 3240_1 of the (1_1)- st subordinate link arm 3240 may be rotatably coupled with the (1_1)-st blade 3171 of the transfer arm platform 3100, and a (3_4)-th opposite-end area 3240_2 of the (1_1)-st subordinate link arm 3240 may be rotatably coupled with a (3_3)-rd one-end area 3230_1 of the first common link arm 3230.

Additionally, the first transfer arm part 3200 may include a (1_2)-nd subordinate link arm 3250 that is parallel to the (1_1)-st transfer link arm 3210, wherein a (3_5)-th one-end area 3250_1 of the (1_2)-nd subordinate link arm 3250 may be rotatably coupled with the (1_2)-nd blade 3172 of the transfer arm platform 3100, and a (3_5)-th opposite-end area 3250_2 of the (1_2)-nd subordinate link arm 3250 may be rotatably coupled with a (3_3)-rd opposite-end area 3230_2 of the first common link arm 3230.

Accordingly, two single parallel links may be formed as a double parallel link, wherein each of the two single parallel links shares the (1_1)-st transfer link arm 3210 with each other.

In other words, one single parallel link is formed by a frame, an input link, a connecting arm and a follower. Herein, the frame is formed by two joints, wherein one joint is where the (3_1)-st one-end area 3210_1 of the (1_1)-st transfer link arm 3210 is coupled with the c2-nd coupling hole 3120 of the transfer arm platform 3100 and another joint is where the (3_4)-th one-end area 3240_1 of the (1_1)-st subordinate link arm 3240 is coupled with the (1_1)-st blade 3171 of the transfer arm platform 3100. Further, the input link is formed by the (1_1)-st transfer link arm 3210. Further, the connecting arm is formed by the common link arm between two joints, wherein one joint is where the (3_1)-st opposite-end area 3210_2 of the (1_1)-st transfer link arm 3210 is coupled with the third center area of the first common link arm 3230 and another joint is where the (3_3)-rd one-end area 3230_1 of the first common link arm 3230 is coupled with the (3_4)-th opposite-end area 3240_2 of the (1_1)-st subordinate link arm 3240. Further, the follower is formed by the (1_1)-st subordinate link arm 3240. Herein, the frame is a concept that may or may not physically exist, and is a reference line or a reference plane that fixes one-end of the input link and one-end of the follower that constitute the parallel link. Thus, the frame mentioned below should be interpreted similarly.

Also, another single parallel link is formed by a frame, an input link, a connecting arm and a follower. Herein, the frame is formed by two joints, wherein one joint is where the (3_1)-th one-end area 3210_1 of the (1_1)-st transfer link arm 3210 is coupled with the c2-nd coupling hole 3120 of the transfer arm platform 3100 and another joint is where the (3_5)-th one-end area 3250_1 of the (1_2)-nd subordinate link arm 3250 is coupled with the (1_2)-nd blade 3172 of the transfer arm platform 3100. Further, the input link is formed by the (1_1)-st transfer link arm 3210. Further the connecting arm is formed by the common link arm between two joints, wherein one joint is where the (3_1)-st opposite-end area 3210_2 of the (1_1)-st transfer link arm 3210 is coupled with the third center area of the first common link arm 3230 and another joint is where the (3_3)-rd opposite-end area 3230_2 of the first common link arm 3230 is coupled with the (3_5)-th opposite-end area 3250_2 of the (1_2)-nd subordinate link arm 3250. Further, the follower is formed by the (1_2)-nd subordinate link arm 3250.

By means of such double parallel links, vibration and/or disturbance of the first end effector 3400 during the movement along a transfer route can be reduced.

In addition, the first transfer link arm part 3200 may include a (1_3)-st subordinate link arm 3260, which is parallel to the (1_2)-nd transfer link arm 3220, wherein a (3_6)-th one-end area 3260_1 of the (1_3)-rd subordinate link arm 3260 is rotatably coupled with the (3_3)-rd opposite-end area 3230_2 of the first common link arm 3230. Herein, the joint where the (3_6)-th one-end area 3260_1 of the (1_3)-rd subordinate link 3260 is coupled with the (3_3)-rd opposite-end area 3230_2 of the first common link arm 3230 may be formed at the same position with the joint where the (3_5)-th opposite-end area 3250_2 of the (1_2)-rd subordinate link arm 3250 is coupled with the (3_3)-rd opposite-end area 3230_2 of the first common link arm 3230, or may be formed at a different position.

Also, the first transfer link arm part 3200 may include a (1_4)-st subordinate link arm 3270, which is parallel to the first common link arm 3230, wherein the (3_7)-th one-end area 3270_1 of the (1_4)-th subordinate link arm 3270 is rotatably coupled with the (3_6)-th opposite-end area 3260_2 of the (1_3)-rd subordinate link arm 3260 and the (3_7)-th opposite-end area 3270_2 of the (1_4)-th subordinate link arm 3270 is rotatably coupled with the (3_2)-nd opposite-end area 3220_2 of the (1_2)-nd transfer link arm 3220.

In addition, the first transfer link arm 3200 may include the first end-effector 3400, wherein the first end-effector 3400 is fixed to the (3_7)-th opposite-end area 3270_2 of the (1_4)-th subordinate link arm 3270, thereby supporting the substrate.

For reference, FIG. 8B illustrates a plate formed integrally with the (1_4)-th subordinate link arm 3270, wherein the plate is used for fixing the forks of the first end-effector 3400 capable of supporting the substrates.

The first transfer arm part 3200 configured like above allows the first end-effector 3400 to move forward or backward by using each of the transfer arms and subordinate arms along a straight path according to the first transfer driving motor 3211, thereby allowing the substrate to be loaded or unloaded at a predetermined position through the first end-effector 3400.

Also, by referring to FIG. 8A and FIG. 8B again, the second transfer arm part 3300 may be configured similarly to the first transfer arm part 3200, and may be installed on the transfer arm platform 3100 so as to be symmetrical to the first transfer arm part 3200 about the center line CL of the transfer arm platform 3100.

In other words, the (2_1)-st transfer link arm 3310 of the second transfer arm part 3300 has a sealed inner space where the second transfer driving motor and the fourth speed reducer are installed, wherein the fourth speed reducer is interlocked with the second transfer driving motor to reduce a rotational speed of the second transfer driving motor by half.

Also, a (4_1)-st hollow driving shaft interlocked with the fourth speed reducer and a (4_1)-st output shaft interlocked with the (4_1)-st hollow driving shaft may be sealingly installed on a (4_1)-st one-end area 3310_1 of the (2_1)-st transfer link arm 3310, and a (4_2)-nd hollow driving shaft interlocked with the second transfer driving motor and a (4_2)-nd output shaft interlocked with the (4_2)-nd hollow driving shaft may be sealingly installed on a (4_1)-st opposite-end area 3310_2 of the (2_1)-st transfer link arm 3310. Herein, the interlocking between the second transfer driving motor and the fourth speed reducer, the interlocking between the fourth speed reducer and the (4_1)-st hollow driving shaft, and the interlocking between the second transfer driving motor and the (4_2)-nd hollow driving shaft may be achieved by pulley method, respectively, however, the present disclosure is not limited thereto. For example, various methods, such as a method of using gears, etc. may be adopted to transmit a rotational force. Also, not only the (4_1)-st hollow driving shaft with the (4_1)-st output shaft but also the (4_2)-nd hollow driving shaft with the (4_2)-nd output shaft can be formed by speed reducers each of which has a same reduction ratio. In addition, the (4_1)-st output shaft and the (4_2)-nd output shaft can be driven with opposite rotation directions.

Also, the (4_1)-st output shaft may be inserted into the c3-rd upper space of the c3-rd coupling hole 3130 of the transfer arm platform 3100 to be fixedly coupled with the c3-rd stopping member. Herein the (4_1)-st output shaft is installed on a (4_1)-st one-end area 3310_1 of the (2_1)-st transfer link arm 3310 of the second transfer arm part 3300.

Herein, a (2_2)-nd linking member is a tube-shaped shaft and may be used for coupling the (4_1)-st output shaft with the c3-rd stopping member, and each of the two-ends of the (2_2)-nd linking member can be fixedly coupled with each of the (4_1)-st output shaft and the c3-rd stopping member. Herein, the length of the (2_2)-nd linking member is same as or larger than a distance between the (4_1)-st output shaft and the c3-rd stopping member, specifically at the position where the transfer arm platform 3100 is coupled with the (2_1)-st transfer link arm 3310.

Also, a (4_2)-nd output of the (2_1)-st transfer link arm 3310 of the second transfer arm part 3300 may be fixedly coupled with a (4_2)-nd one-end area 3320_1 of the (2_2)-nd transfer link arm 3320.

Herein, a second fixed coupling shaft 3318 is a tube-shaped shaft and may be used for coupling the (4_2)-nd output shaft of the (2_1)-st transfer link arm 3310 and the (4_2)-nd one-end area 3320_1 of the (2_2)-nd transfer link arm 3320, and each of the two-ends of the second fixed coupling shaft 3318 can be fixedly coupled with each of the (4_2)-nd output shaft and the (4_2)-nd one-end area 3320_1. Herein, the length of the second fixed coupling shaft 3318 is same as or larger than a distance between the (4_2)-nd output shaft and the (4_2)-nd one-end area 3320_1, specifically at the position where the (2_1)-st transfer link arm 3310 is coupled with the (2_2)-nd transfer link arm 3320. Also, a height of the second fixed coupling shaft 3318, which connects the (2_1)-st transfer link arm 3310 with the (2_2)-nd transfer link arm 3320 of the second transfer arm part 3300, may be set as higher than a height of the first fixed coupling shaft which connects the (1_1)-st transfer link arm 3210 with the (1_2)-nd transfer link arm 3220 of the first transfer arm part 3200. Accordingly, the first end-effector 3400 of the first transfer arm part 3200 and the second end-effector 3500 of the second transfer arm part 3300 are positioned at different heights on a same transferring route. However, the present disclosure is not limited thereto. As another example, the height of the first fixed coupling shaft may be set as higher than a height of the second fixed coupling shaft.

Next, a second common link arm 3330 may be installed at a location where the (2_1)-st transfer link arm 3310 is coupled with (2_2)-nd transfer link arm 3320, in other words, at a location where the (4_2)-nd output shaft is coupled with the (4_2)-nd one-end area 3320_1.

That is, a fourth center area may be rotatably coupled with the second fixed coupling shaft, wherein the second fixed coupling shaft combines the (4_2)-nd output shaft and the (4_2)-nd one-end area 3320_1.

In addition, the second transfer arm part 3300 may include the (2_1)-st subordinate link arm 3340 that is parallel to the (2_1)-st transfer link arm 3310, wherein a (4_4)-th one-end area 3340_1 of the (2_1)-st subordinate link arm 3340 may be rotatably coupled with the (2_1)-st blade 3181 of the transfer arm platform 3100, and a (4_4)-th opposite-end area 3340_2 of the (2_1)-st subordinate link arm 3340 may be rotatably coupled with a (4_3)-rd one-end area 3330_1 of the second common link arm 3330.

Also, the second transfer arm part 3300 may include a (2_2)-nd subordinate link arm 3350 that is parallel to the (2_1)-nd transfer link arm 3310, wherein a (4_5)-th one-end area 3350_1 of the (2_2)-nd subordinate link arm 3350 may be rotatably coupled with the (2_2)-nd blade 3182 of the transfer arm platform 3100, and a (4_5)-th opposite-end area 3350_2 of the (2_2)-nd subordinate link arm 3350 may be rotatably coupled with a (4_3)-rd opposite-end area 3330_2 of the second common link arm 3330.

Accordingly, two single parallel links may be formed as a double parallel link, wherein each of the two single parallel links shares the (2_1)-st transfer link arm 3310 with each other.

In other words, one single parallel link is formed by a frame, an input link, a connecting arm and a follower. Herein, the frame is formed by two joints, wherein one joint is where the (4_1)-st one-end area 3310_1 of the (2_1)-st transfer link arm 3310 is coupled with the c3-rd coupling hole 3320 of the transfer arm platform 3100 and another joint is where the (4_4)-th one-end area 3340_1 of the (2_1)-st subordinate link arm 3340 is coupled with the (2_1)-st blade 3181 of the transfer arm platform 3100. Further, the input link is formed by the (2_1)-st transfer link arm 3310. Further, the connecting arm is formed by the second common link arm 3330 between two joints, wherein one joint is where the (4_1)-st opposite-end area 3310_2 of the (2_1)-st transfer link arm 3310 is coupled with the fourth center area of the second common link arm 3330 and another joint is where the (4_3)-rd one-end area 3330_1 of the second common link arm 3330 is coupled with the (4_4)-th one-end area 3340_1 of the (2_1)-st subordinate link arm 3340. Further, the follower is formed by the (2_1)-st subordinate link arm 3340.

Also, another single parallel link is formed by a frame, an input link, a connecting arm and a follower. Herein, the frame is formed by two joints, wherein one joint is where the (4_1)-th one-end area 3310_1 of the (2_1)-st transfer link arm 3310 is coupled with the c3-rd coupling hole 3130 of the transfer arm platform 3100 and another joint is where the (4_5)-th one-end area 3350_1 of the (2_2)-nd subordinate link arm 3350 is coupled with the (2_2)-nd blade 3182 of the transfer arm platform 3100. Further, the input link is formed by the (2_1)-st transfer link arm 3310. Further, the connecting arm is formed by the second common link arm 3330 between two joints, wherein one joint is where the (4_1)-st opposite-end area 3310_2 of the (2_1)-st transfer link arm 3310 is coupled with the fourth center area of the second common link arm 3330 and another joint is where the (4_3)-rd opposite-end area 3330_2 of the second common link arm 3330 is coupled with the (4_5)-th opposite-end area 3350_2 of the (2_2)-nd subordinate link arm 3350. Further, the follower is formed by the (2_2)-nd subordinate link arm 3350.

By means of such a double parallel link, vibration and/or disturbance of the second end-effector 3500 during the movement along the transfer route can be reduced.

Also, the second transfer link arm part 3300 may include a (2_3)-rd subordinate link arm 3360, which is parallel to the (2_2)-nd transfer link arm 3320, wherein a (4_6)-th one-end area 3360_1 of the (2_3)-rd subordinate link arm 3360 is rotatably coupled with the (4_3)-rd opposite-end area 3330_2 of the second common link arm 3330. Herein, the joint where the (4_6)-th one-end area 3360_1 of the (2_3)-rd subordinate link arm 3360 is couple with the (4_3)-rd opposite-end area 3330_2 of the second common link arm 3330 may be formed at the same position with the joint where the (4_5)-th opposite-end area 3350_2 of the (2_2)-nd subordinate link arm 3350 is coupled with the (4_3)-rd opposite-end area 3330_2 of the second common link arm 3330, or may be formed at a different position.

In addition, the second transfer link arm part 3300 may include a (2_4)-th subordinate link arm 3370, which is parallel to the second common link arm 3330, wherein the (4_7)-th one-end area 3370_1 of the (2_4)-th subordinate link arm 3370 is rotatably coupled with the (4_6)-th opposite-end area 3360_2 of the (2_3)-rd subordinate link arm 3360 and the (4_7)-th opposite-end area 3370_2 of the (2_4)-th subordinate link arm 3370 is rotatably coupled with the (4_2)-nd opposite-end area 3320_2 of the (2_2)-nd transfer link arm 3320.

Also, the second transfer link arm part 3300 may include the second end-effector 3500, wherein the second end-effector 3500 is fixed to the (4_7)-th opposite-end area 3370_2 of the (2_4)-th subordinate link arm 3370, thereby supporting the substrate. For reference, FIG. 8B illustrates the plate formed separately with the (2_4)-th subordinate link arm 3370, wherein the plate is used for fixing the forks of the second end-effector 3500 capable of supporting the substrates. Herein, the plate for fixing the forks of the second end-effector 3500 capable of supporting the substrates is fixedly coupled with the (4_7)-th opposite-end area 3370_2 of the (2_4)-th subordinate link arm 3370.

The second transfer arm part 3300 configured like above allows the second end-effector 3500 to move forward or backward by using each of the transfer arms and subordinate arms along a straight path according to the second transfer driving motor, thereby allowing the substrate to be loaded or unloaded at a predetermined position through the second end-effector 3500.

Herein, the (3_1)-st opposite-end area 3210_2 of the (1_1)-st transfer link arm 3210 of the first transfer arm part 3200 and the (4_1)-st opposite-end area 3310_2 of the (2_1)-st transfer link arm 3310 of the second transfer arm part 3300 can be located in the same forward part or the backward part of the transfer arm platform 3100.

As another example, the (3_1)-st opposite-end area 3210_2 of the (1_1)-st transfer link arm 3210 of the first transfer arm part 3200 can be located in the forward part of the transfer arm platform 3100 and the (4_1)-st opposite-end area 3310_2 of the (2_1)-st transfer link arm 3310 of the second transfer arm part 3300 can be located in the backward part of the transfer arm platform 3100.

In addition, the third wiring for the operation of the first transfer driving motor 3211 and the fourth wiring for the operation of the second transfer driving motor can each be located in a sealed space inside the transfer robot 3000.

Herein, the third wiring may be introduced into the first transfer driving motor 3211 through each of hollow holes of (i) at least one of the hollow elevating shafts, (ii) the (1_1)-st hollow driving shaft 2213, the (1_2)-nd hollow driving shaft 2216, the rotation driving shaft 2410 of the travel robot 2000 and (iii) the (3_1)-st hollow driving shaft 3213 of the transfer robot 3000 so as to prevent the third wiring from being exposed to an inner space of the vacuum chamber, and the fourth wiring may be introduced into the second transfer driving motor through each of hollow holes of (i) at least one of the hollow elevating shafts, (ii) the (2_1)-st hollow driving shaft, the (2_2)-nd hollow driving shaft, the rotation driving shaft 2410 of the travel robot 2000 and (iii) the (4_1)-st hollow driving shaft of the transfer robot 3000 so as to prevent the fourth wiring from being exposed to an inner space of the vacuum chamber.

Meanwhile, the third wiring and the fourth wiring may be respectively branched from the rotation driving shaft 2410 into the first transfer arm part 3200 and the second transfer arm part 3300, through the wiring holes formed in the transfer arm platform 3100.

According to the substrate transfer apparatus in accordance with one embodiment of the present disclosure configured as described above, a plurality of the hollow elevating shafts of the elevating robot are formed along the first straight direction, the travel arm platform of the travel robot is coupled with the plurality of the hollow elevating shafts, and each of the travel arm parts is coupled with each of two areas symmetrical to each other based on the first straight direction in which the plurality of the hollow elevating shafts are combined on the travel arm platform, thereby improving the amount of drooping of the robots when transferring a high-load substrate over a long distance.

Therefore, in a substrate transfer apparatus according to one embodiment of the present disclosure, the amount of drooping caused by a high-load substrate can be improved, so that the high-load substrate can be transferred to a correct position within the process chamber.

The present disclosure has an effect of the present disclosure to provide the substrate transfer apparatus capable of accurately transferring the high-load substrate over the long distance.

The present disclosure has another effect of the present disclosure to provide the substrate transfer apparatus capable of reducing drooping of robots when transferring the high-load substrate over the long distance.

The present disclosure still has another her effect of the present disclosure to provide the substrate transfer apparatus capable of reducing substrate slip at a process station when transferring the high-load substrate over the long distance.

The present disclosure still yet has another her effect of the present disclosure to provide a substrate transfer apparatus capable of accurately positioning the substrate at the process station when transferring the high-load substrate over the long distance.

As seen above, the present invention has been explained by specific matters such as detailed components, limited embodiments, and drawings. They have been provided only to help more general understanding of the present invention. It, however, will be understood by those skilled in the art that various changes and modification may be made from the description without departing from the spirit and scope of the invention as defined in the following claims.

Accordingly, the thought of the present invention must not be confined to the explained embodiments, and the following patent claims as well as everything including variations equal or equivalent to the patent claims pertain to the category of the thought of the present invention.

What is claimed is:

1. A substrate transfer apparatus that transfers a substrate in a vacuum chamber, comprising:
   an elevating robot including: (i) an elevating plate through which an (a1_1)-st through-hole to an (a1_n)-th through-hole are formed along to a first straight direction on a plane, wherein n is an integer greater than or equal to 2, wherein the elevating plate is formed in a lower part of the vacuum chamber to move up and down by an elevation driving unit, and (ii) a first hollow elevating shaft to an n-th hollow elevating shaft, wherein each of the first hollow elevating shaft to the n-th hollow elevating shaft has each one-end connected to an upper surface of the elevating plate and each opposite-end located in an inner space of the vacuum chamber such that each central axis of each of the first hollow elevating shaft to the n-th hollow elevating shaft corresponds to each center of each of the (a1_1)-st through-hole to the (a1_n)-th through-hole, wherein the elevating robot is sealably coupled with a vacuum chamber through-hole formed in a lower region of the vacuum chamber;

a travel robot including: (i) a travel arm platform through which a (b1_1)-st coupling hole to a (b1_n)-th coupling hole, a b2-nd coupling hole and a b3-rd coupling hole are formed respectively in the first straight direction, a first one-end area in a second straight direction orthogonal to the first straight direction and a first opposite-end area in the second straight direction thereof, wherein each of a (b1_1)-st stopping member to a (b1_n)-th stopping member, through which each of a (b1_1)-st through-hole to a (b1_n)-th through-hole corresponding to each of hollow holes of the first hollow elevating shaft to the n-th hollow elevating shaft is formed, compartmentalizes each of the (b1_1)-st coupling hole to the (b1_n)-th coupling hole into each of a (b1_1)-st upper space to a (b1_n)-th upper space sealed by each of a (b1_1)-st cover to a (b1_n)-th cover and each of a (b1_1)-st lower space to a (b1_n)-th lower space, wherein a b2-nd stopping member, through which a b2-nd through-hole is formed, compartmentalizes the b2-nd coupling hole into a b2-nd upper space and a b2-nd lower space which is sealed by a b2-nd cover, wherein a b3-rd stopping member, through which a b3-rd through-hole is formed, compartmentalizes the b3-rd coupling hole into a b3-rd upper space and a b3-rd lower space which is sealed by a b3-rd cover, and wherein each of the opposite ends of the first hollow elevating shaft to n-th hollow elevating shaft inserted into each of the (b1_1)-st lower space to the (b1_n)-th lower space is fixedly coupled with each of the (b1_1)-st stopping member to the (b1_n)-th stopping member, (ii) a first travel arm part including a (1_1)-st travel link arm and a (1_2)-nd travel link arm, wherein a first travel driving motor and a first speed reducer, interlocked with the first travel driving motor to reduce a rotational speed of the first travel driving motor by half, are installed in a sealed inner space of the (1_1)-st travel link arm, wherein a (1_1)-st hollow driving shaft interlocked with the first speed reducer and a (1_1)-st output shaft interlocked with the (1_1)-st hollow driving shaft are sealingly installed on a (1_1)-st one-end area of the (1_1)-st travel link arm, wherein a (1_2)-nd hollow driving shaft interlocked with the first travel driving motor and a (1_2)-nd output shaft interlocked with the (1_2)-nd hollow driving shaft are sealingly installed on a (1_1)-st opposite-end area of the (1_1)-st travel link arm, wherein the (1_1)-st output shaft of the (1_1)-st travel link arm is fixedly coupled with a (1_1)-st linking member that is inserted into the b2-nd upper space of the travel arm platform to be fixedly coupled with the b2-nd stopping member, and wherein a (1_2)-nd one-end area of the (1_2)-nd travel link arm is fixedly coupled with the (1_2)-nd output shaft of the (1_1)-st travel link arm, (iii) a second travel arm part including a (2_1)-st travel link arm and a (2_2)-nd travel link arm, wherein a second travel driving motor and a second speed reducer, interlocked with the second travel driving motor to reduce a rotational speed of the second travel driving motor by half, are installed in a sealed inner space of the (2_1)-st travel link arm, wherein a (2_1)-st hollow driving shaft interlocked with the second speed reducer and a (2_1)-st output shaft interlocked with the (2_1)-st hollow driving shaft are sealingly installed on a (2_1)-st one-end area of the (2_1)-st travel link arm, wherein a (2_2)-nd hollow driving shaft interlocked with the second travel driving motor and a (2_2)-nd output shaft interlocked with the (2_2)-nd hollow driving shaft are sealingly installed on a (2_1)-st opposite-end area of the (2_1)-st travel link arm, wherein the (2_1)-st output shaft of the (2_1)-st travel link arm is fixedly coupled with a (1_2)-nd linking member that is inserted into the b3-rd upper space of the travel arm platform to be fixedly coupled with the b3-rd stopping member, and wherein a (2_2)-nd one-end area of the (2_2)-nd travel link arm is fixedly coupled with the (2_2)-nd output shaft of the (2_1)-st travel link arm, and (iv) a transfer robot coupling part whose second one-end area is rotatably coupled with a (1_2)-nd opposite-end area of the (1_2)-nd travel link arm, whose second opposite-end area is rotatably coupled with a (2_2)-nd opposite-end area of the (2_2)-nd travel link arm, and whose first center area has a rotation driving motor built thereon; and wherein the travel robot reciprocates the transfer robot coupling part in the first straight direction by an operation of the first travel motor and the second travel motor; and a transfer robot, coupled with the transfer robot coupling part, configured to transfer the substrate.

2. The substrate transfer apparatus of claim 1, wherein the elevation driving unit of the elevating robot includes:
 a first screw nut to be fixedly coupled with a one-side of the elevating plate;
 a second screw nut to be fixedly coupled with an opposite-side symmetrical to the one-side of the elevating plate;
 a first screw shaft formed in a vertical direction perpendicular to the first straight direction and perpendicular to the ground, and coupled with the first screw nut to rotate;
 a second screw shaft formed in the vertical direction, and coupled with the second screw nut to rotate;
 an elevation driving motor configured to provide a driving force for rotating the first screw shaft and the second screw shaft; and
 a first belt and a second belt configured to transmit the driving force of the elevation driving motor to the first screw shaft and the second screw shaft, respectively.

3. The substrate transfer apparatus of claim 2, wherein the elevation driving unit of the elevating robot further includes:
 at least one first sliding guide formed on the one-side of the elevating plate and supporting a direction of up and down movement of the elevating plate; and
 at least one second sliding guide formed on the opposite-side of the elevating plate and supporting the direction of up and down movement of the elevating plate.

4. The substrate transfer apparatus of claim 1, wherein the elevating robot further includes:
 an a-th cover through which an (a2_1)-st through-hole to an (a2 n)-th through-hole are formed along the first straight direction, wherein each of the first hollow elevating shaft to the n-th hollow elevating shaft is inserted into the (a2_1)-st through-hole to the (a2_n)-th through-hole, and wherein the a-th cover is sealingly coupled with the vacuum chamber through-hole of the vacuum chamber, a first bellows to an n-th bellows through which each of the first hollow elevating shaft to the n-th hollow elevating shaft is inserted, and wherein a one end thereof is coupled with the upper surface of the elevating plate and an opposite end thereof is coupled with the a-th cover.

5. The substrate transfer apparatus of claim 1, wherein the transfer robot coupling part of the transfer robot further includes: a compliance configured to change, within the transfer robot coupling part, any one of a position where the (1_2)-nd opposite-end area of the (1_2)-nd travel link arm is rotatably coupled and a position where the (2_2)-nd opposite-end area of the (2_2)-nd travel link arm is rotatably coupled, in response to an external force, wherein the compliance is installed at any one end area of the second one-end area and the second opposite-end area.

6. The substrate transfer apparatus of claim 5, wherein the compliance includes:
   (i) a compliance body, which is movable in a longitudinal direction of the transfer robot coupling part within any one end area of the second one-end area and the second opposite-end area, and which is rotatably coupled with any one of the (1_2)-nd opposite-end area of the (1_2)-nd travel link arm and the (2_2)-nd opposite-end area of the (2_2)-nd travel link arm, (ii) at least one first sliding member formed in an upper surface of the compliance body, (iii) at least one second sliding member whose one-side surface is coupled with the first sliding member to be slid in the longitudinal direction of the transfer robot coupling part and whose opposite-side surface is fixedly coupled with the transfer robot coupling part, (iv) elastic members respectively formed in both sides of a moving path of the compliance body.

7. The substrate transfer apparatus of claim 1, wherein the travel arm platform of the travel robot includes:
   a first wiring hole configured to connect a (b1_k)-th upper space, which is any one of the (b1_1)-st upper space to the (b1_n)-th upper space, with the b2-nd lower space; and
   a second wiring hole configured to connect the (b1 k)-th upper space with the b3-rd lower space.

8. The substrate transfer apparatus of claim 1, wherein the travel arm platform of the travel robot includes:
   a (1_1)-st wiring hole configured to connect from a one-side surface of a body of the travel arm platform to a (b1_k)-th upper space, which is any one of the (b1_1)-st upper space to the (b1_n)-th upper space;
   a (2_1)-st wiring hole configured to connect from the one-side surface of the body of the travel arm platform to the b2-nd lower space;
   a (1_2)-nd wiring hole configured to connect from an opposite-side surface of the body of the travel arm platform, which is symmetrical to the one-side of the body of the travel arm platform based on the first straight direction, to the (b1_k)-th upper space;
   a (2_2)-nd wiring hole configured to connect from the opposite-side surface of the body of the travel arm platform to the b3-rd lower space;
   a first sealing cover configured to seal the (1_1)-st wiring hole and the (2_1)-st wiring hole on the one-side surface of the body of the travel arm platform; and
   a second sealing cover configured to seal the (1_2)-nd wiring hole and the (2_2)-nd wiring hole on the opposite-side surface of the body of the travel arm platform.

9. The substrate transfer apparatus of claim 1, wherein the travel robot is provided with a (1_1)-st intersection point, a (1_2)-nd intersection point, a (2_1)-st intersection point, a (2_2)-nd intersection point, a (3_1)-st intersection point and a (3_2)-nd intersection point, wherein the (1_1)-st intersection point is a point at which a second straight direction line, connecting a center point of the b2-nd coupling hole and a center point of the b3-rd coupling hole of the travel arm platform, and a longitudinal center line of the (1_1)-st travel link arm intersect, wherein the (1_2)-nd intersection point is a point at which the second straight direction line and a longitudinal center line of the (2_1)-st travel link arm intersect, wherein the (2_1)-st intersection point is a point at which the longitudinal center line of the (1_1)-st travel link arm and a longitudinal center line of the (1_2)-nd travel link arm intersect, wherein the (2_2)-nd intersection point is a point at which the longitudinal center line of the (2_1)-st travel link arm and a longitudinal center line of the (2_2)-nd travel link arm intersect, wherein the (3_1)-st intersection point is a point at which the longitudinal center line of the (1_2)-nd travel link arm and a longitudinal center line of the transfer robot coupling part intersect, and wherein the (3_2)-nd intersection point is a point at which the longitudinal center line of the (2_2)-nd travel link arm and the longitudinal center line of the transfer robot coupling part intersect,
   wherein a distance between the (1_1)-st intersection point and the (1_2)-nd intersection point and a distance between the (3_1)-st intersection point and the (3_2)-nd intersection point are determined as same with each other, and a distance between the (1_1)-st intersection point and the (2_1)-st intersection point, a distance between the (2_1)-st intersection point and the (3_1)-st intersection point, a distance between the (1_2)-nd intersection point and the (2_2)-nd intersection point and a distance between the (2_2)-nd intersection point and the (3_2)-nd intersection point are determined as same with each other, and
   wherein an absolute value of an angle formed between the travel arm platform and the (1_1)-st travel link arm at the (1_1)-st intersection point is determined as same with an absolute value of an angle formed between the travel arm platform and the (2_1)-st travel link arm at the (1_2)-nd intersection point, an absolute value of an angle formed between the (1_1)-st travel link arm and the (1_2)-nd travel link arm at the (2_1)-st intersection point is determined as same with an absolute value of an angle formed between the (2_1)-st travel link arm and the (2_2)-nd travel link arm at the (2_2)-nd intersection point, and an absolute value of an angle formed between the (1_2)-nd travel link arm and the transfer robot coupling part at the (3_1)-st intersection point is determined as same with an absolute value of an angle formed between the (2_2)-nd travel link arm and the transfer robot coupling part at the (3_2)-nd intersection point.

10. The substrate transfer apparatus of claim 1, wherein the first travel driving motor and the second travel driving motor of the travel robot operate in the same manner but with opposite rotation directions.

11. The substrate transfer apparatus of claim 1, wherein the transfer robot includes:
   a transfer arm platform including (i) a c1-st coupling hole, formed at a second center area which is a specific area on the center line corresponding to the linear movement direction of the substrate moved by the transfer robot, wherein a c1-st stopping member, through which a c1-st through-hole corresponding to a hollow hole of a rotation driving shaft of the rotation driving motor of the transfer robot coupling part is formed, compartmentalizes the c1-st coupling hole into a c1-st upper space sealed by a c1-st cover and a c1-st lower space, (ii) a c2-nd coupling hole, formed at a third one-side area which is a one-side area with the center line, wherein a c2-nd stopping member, through which a c2-nd through-hole is formed, compartmentalize the c2-nd coupling hole into a c2-nd upper space and a c2-nd lower space which is sealed by a c2-nd cover, (iii) a c3-rd coupling hole, formed at a third opposite-side area which is an opposite-side area with the center line corresponding to the third one-side area, wherein a c3-rd stopping member, through which a c3-rd through-hole is formed, compartmentalizes the c3-rd coupling hole into a c3-rd upper space and a c3-rd lower space which is sealed by a c3-rd cover, (iv) a (1_1)-st blade and a (1_2)-nd blade formed respectively at a forward part and a backward part of the c2-nd coupling hole, wherein the forward part corresponds to a direction in which a processing chamber is positioned while the transfer robot is positioned to transfer a substrate to the processing chamber which is coupled with the vacuum chamber, and wherein the backward part corresponds to an opposite direction of the forward part, (v) a (2_1)-st blade and a (2_2)-nd blade formed respectively at the forward part and the backward part of the c3-rd coupling hole; and wherein the rotation driving shaft of the rotation driving motor inserted into the c1-st lower space is fixedly coupled with the c1-st stopping member, a first transfer arm part including a (1_1)-st transfer link arm, a (1_2)-nd transfer link arm, a first common link arm, a (1_1)-st subordinate link arm which is parallel to the (1_1)-st transfer link arm, a (1_2)-nd subordinate link arm which is parallel to the (1_1)-st transfer link arm, a (1_3)-rd subordinate link arm which is parallel to the (1_2)-nd transfer link arm, a (1_4)-th subordinate link arm which is parallel to the first common link arm and a first end-effector, wherein a first transfer driving motor and a third speed reducer, interlocked with the first transfer driving motor to reduce a rotational speed of the first transfer driving motor by half, are installed in a sealed inner space of the (1_1)-st transfer link arm, wherein a (3_1)-st hollow driving shaft interlocked with the third speed reducer and a (3_1)-st output shaft interlocked with the (3_1)-st hollow driving shaft are sealingly installed on a (3_1)-st one-end area of the (1_1)-st transfer link arm, wherein a (3_2)-nd hollow driving shaft interlocked with the first transfer driving motor and a (3_2)-nd output shaft interlocked with the (3_2)-nd hollow driving shaft are sealingly installed on a (3_1)-st opposite-end area of the (1_1)-st transfer link arm, wherein the (3_1)-st output shaft of the (1_1)-st transfer link arm is fixedly coupled with a (2_1)-st linking member that is inserted into the c2-nd upper space of the transfer arm platform to be fixedly coupled with the c2-nd stopping member, wherein a (3_2)-nd one-end area of the (1_2)-nd transfer link arm is fixedly coupled with the (3-2)-nd output shaft of the (1_1)-st transfer link arm through a first fixed coupling shaft, wherein a third center area of the first common link arm is rotatably coupled with the first fixed coupling shaft, wherein a (3_4)-th one-end area of the (1_1)-st subordinate link arm is rotatably coupled with the (1_1)-st blade of the transfer arm platform and a (3_4)-th opposite-end area of the (1_1)-st subordinate link arm is rotatably coupled with a (3_3)-rd one-end area of the first common link arm, wherein a (3_5)-th one-side area of the (1_2)-nd subordinate link arm is rotatably coupled with the (1_2)-nd blade of the transform arm platform and a (3_5)-th opposite-end area of the (1_2)-nd subordinate link arm is rotatably coupled with a (3_3)-rd one-end area of the first common link arm, wherein (3_6)-th one-end area of the (1_3)-rd subordinate link arm is rotatably coupled with a (3_3)-rd opposite-end area of the first common link arm, wherein a (3_7)-th one-end area of the (1_4)-th subordinate link arm is rotatably coupled with a (3_6)-th opposite-end area of the (1_3)-nd subordinate link arm and a (3_7)-th opposite-end area of the (1_4)-th subordinate link arm is rotatably coupled with the (3_2)-nd opposite-end area of the (1_2)-nd transfer link arm, and wherein the first end-effector is fixed to the (3_7)-th opposite-end area of the (1_4)-th subordinate link arm to thereby support the substrate; and a second transfer arm part including a (2_1)-st transfer link arm, a (2_2)-nd transfer link arm, a second common link arm, a (2_1)-st subordinate link arm parallel to the (2_1)-st transfer link arm, a (2_2)-nd subordinate link arm parallel to the (2_1)-st transfer link arm, a (2_3)-rd subordinate link arm parallel to the (2_2)-nd transfer link arm, a (2_4)-th subordinate link arm parallel to the second common link arm, and a second end-effector, wherein a second transfer driving motor and a fourth speed reducer, interlocked with the second transfer driving motor to reduce a rotational speed of the second transfer driving motor by half, are installed in a sealed inner space of the (2_1)-st transfer link arm, wherein a (4_1)-st hollow driving shaft interlocked with the fourth speed reducer and a (4_1)-st output shaft interlocked with the (4_1)-st hollow driving shaft are sealingly installed on a (4_1)-st one-end area of the (2_1)-st transfer link arm, wherein a (4_2)-nd hollow driving shaft interlocked with the second transfer driving motor and a (4_2)-nd output shaft interlocked with the (4_2)-nd hollow driving shaft are sealingly installed on a (4_1)-st opposite-end area of the (2_1)-st transfer link arm, wherein the (4_1)-st output shaft of the (2_1)-st transfer link arm is fixedly coupled with a (2_1)-st linking member that is inserted into the c3-rd upper space of the transfer arm platform to be fixedly coupled with the c3-rd stopping member, wherein a (4_2)-nd one-end area of the (2_2)-nd transfer link arm is fixedly coupled with the (4_2)-nd output shaft of the (2_1)-st transfer link arm through a second fixed coupling shaft, wherein a fourth center area of the second common link arm is rotatably coupled with the second fixed coupling shaft, wherein a (4_4)-th one-end area of the (2_1)-st subordinate link arm is rotatably coupled with the (2_1)-st blade of the transfer arm platform and a (4_4)-th opposite-end area of the (2_1)-st subordinate link arm is rotatably coupled with a (4_3)-rd one-end area of the second common link arm, wherein a (4_5)-th one-side area of the (2_2)-nd subordinate link arm is rotatably coupled with the (2_2)-nd blade of the transfer arm platform and a (4_5)-th opposite-end area of the (2_2)-nd subordinate link arm is rotatably coupled with a (4_3)-rd one-end area of the second common link arm, wherein the (4_6)-th one-end area of the (2_3)-rd subordinate link arm is rotatably coupled with the (4_3)-rd opposite-end area of the second common link arm, wherein the (4_7)-th one-end area of the (2_4)-th subordinate link arm is rotatably coupled with the (4_6)-th opposite-end area of the (2_3)-nd subordinate link arm and the (4_7)-th opposite-end area of the (2_4)-th subordinate link arm is rotatably coupled with a (4_2)-nd opposite-end area of the (2_2)-nd transfer link arm, and wherein the second end-effector is fixed to the (4_7)-th opposite-end area of the (2_4)-th subordinate link arm to thereby support the substrate.

12. The substrate transfer apparatus of claim 11, wherein a height of the second fixed coupling shaft is set as higher than a height of the first fixed coupling shaft such that the first end-effector and the second end-effector are positioned at different heights on a same route.

13. The substrate transfer apparatus of claim 11, wherein the transfer arm platform further includes a third wiring hole connecting the c1-st upper space and the c2-nd lower space; and a fourth wiring hole connecting the c1-st upper space and the c3-rd lower space.

14. The substrate transfer apparatus of claim 11, wherein the transfer arm platform includes an upper plate and a lower plate, wherein the upper plate includes the (1_1)-st blade, the (1_2)-nd blade, (2_1)-st blade and the (2_2)-nd blade, and wherein the lower plate is coupled with the upper plate,
wherein a c1-st upper coupling hole, which is a part of the c1-st coupling hole, is formed at the second central area of the upper plate, wherein a c2-nd upper coupling hole, which is a part of the c2-nd coupling hole, is formed at the third one-side area of the upper plate, and a c2-nd stopping member, through which the c2-nd through-hole is formed inside the c2-nd upper coupling hole, compartmentalize the inner space of the c2-nd upper coupling hole, wherein a c3-rd upper coupling hole, which is a part of the c3-rd coupling hole, is formed at the third opposite-side area of the upper plate, and a c3-rd stopping member, through which the c3-rd through-hole is formed inside the c3-rd upper coupling hole, compartmentalize the inner space of the c3-rd upper coupling hole,
wherein a c1-st lower coupling hole, which is a part of the c1 coupling hole, is formed at the second central area of the lower plate, and a c1-st stopping member, through which the c1-st through-hole is formed inside the c1-st lower coupling hole, compartmentalize the inner space of the c1-st lower coupling hole, wherein a c2-nd lower coupling hole, which is another part of the c2-nd coupling hole, is formed at the third one-side area of the lower plate, wherein a c3-rd lower coupling hole, which is another part of the c3 coupling hole, is formed at the third opposite-side area of the lower plate.

15. The substrate transfer apparatus of claim 14,
wherein a third upper wiring slot and a fourth upper wiring slot are formed in a lower surface of the upper plate, wherein the third upper wiring slot connects an inner space of the c1-st upper coupling hole with a lower space of the c2-nd upper coupling hole, and the fourth upper wiring slot connects the inner space of the c1-st upper coupling hole with a lower space of the c3-rd upper coupling hole, and
wherein a third lower wiring slot and a fourth lower wiring slot are formed in an upper surface of the lower plate, wherein the third lower wiring slot connects an upper space of the c1-st lower coupling hole with an inner space of the c2-nd lower coupling hole, and the fourth lower wiring slot connects the upper space of the c1-st lower coupling hole with an inner space of the c3-rd lower coupling hole.

* * * * *